US007057922B2

(12) United States Patent
Fukumoto

(10) Patent No.: US 7,057,922 B2
(45) Date of Patent: Jun. 6, 2006

(54) NONVOLATILE SEMICONDUCTOR MEMORY DEVICE

(75) Inventor: Katsumi Fukumoto, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/938,014

(22) Filed: Sep. 10, 2004

(65) Prior Publication Data

US 2005/0122768 A1    Jun. 9, 2005

(30) Foreign Application Priority Data

Sep. 12, 2003  (JP)  ............................. 2003-320905

(51) Int. Cl.
*G11C 11/00* (2006.01)
*G11C 11/14* (2006.01)
*G11C 11/15* (2006.01)

(52) U.S. Cl. ..................... 365/158; 365/171; 365/173

(58) Field of Classification Search ................ 365/158, 365/171, 173, 185.03, 185.11, 185.18, 185.24, 365/185.29, 185.33

See application file for complete search history.

(56) References Cited

U.S. PATENT DOCUMENTS 6,052,310 A * 4/2000 Sunkavalli ............. 365/185.29
6,118,702 A * 9/2000 Shieh et al. ............ 365/185.11
6,473,332 B1  10/2002 Ignatiev et al.
6,868,012 B1 * 3/2005 Natori .................... 365/185.18
6,870,766 B1 * 3/2005 Cho et al. ............... 365/185.03
6,879,521 B1 * 4/2005 Furuyama ............... 365/185.18

FOREIGN PATENT DOCUMENTS

JP    2002-8367 A2    1/2002
JP    2002-170376 A2  6/2002

OTHER PUBLICATIONS

Sharp Laboratories. (Jan. 20, 2003). *Nikkei Electronics* 839:98-105.
Zhuang, W.W. et al. (2002). "Novell Colossal Magnetoresistive Thin Film Nonvolatile Resistance Random Access Memory (RRAM)," *IEEE,* 4 pages.

* cited by examiner

*Primary Examiner*—Trong Phan
(74) *Attorney, Agent, or Firm*—Morrison & Foerster LLP

(57) ABSTRACT

The present invention employs a memory cell structure in that one end of a variable resistance element (1) for storing information by change of electric resistance is connected to a source of a selection transistor (2) to form a memory cell (3) and, in a memory cell array (4), a drain of the selection transistor (2) is connected to a common bit line (BL) in a column direction, the other end of the variable resistance element (1) is connected to a source line (SL) and a gate of the selection transistor (2) is connected to a common word line (WL) in a row direction. In the memory cell structure, an operation of resetting data stored in the memory cell (3) is carried out for each of sectors including the plural memory cells (3) commonly connected to the source line (SL).

25 Claims, 18 Drawing Sheets

NONVOLATILE SEMICONDUCTOR MEMORY DEVICE

CROSS REFERENCE TO RELATED APPLICATIONS

This application is related to Japanese application number 2003-320905 filed on Dec. 9, 2003 whose priority is claimed under 35 USC § 119, the disclosure of which is incorporated by reference in its entirety.

BACKGROUND OF THE INVENTION

1. Field of the Invention

The present invention relates to a nonvolatile semiconductor memory device having a memory cell array in which plural nonvolatile memory cells are arranged in a row direction and a column direction, respectively, and plural word lines and plural bit lines are arranged in the row direction and the column direction, respectively, in order to select a predetermined memory cell or a memory cell group from the plural memory cells. More particularly, the present invention relates to a nonvolatile semiconductor memory device in which each memory cell includes a variable resistance element for storing information by change in electric resistance, thus allowing data to be electrically written and reset (erased).

2. Description of the Related Art

Examples of a nonvolatile semiconductor memory device capable of electrically writing and resetting (erasing) data with the use of a variable resistance element include an MRAM (Magnetic Random Access Memory) and an RRAM (Resistance control nonvolatile RAM) which will be described later.

In the MRAM, an MRAM memory element including a variable resistance element has a ferromagnetic layer where the resistance is determined by magnetization in a direction. The resistance in the memory element is small when the magnetization across the ferromagnetic layer is in parallel. On the other hand, the resistance in the memory element is large when the magnetization across the ferromagnetic layer is not in parallel. The layer construction of the MRAM memory element is formed by a GMR (Giant MagnetoResistive) memory, a TMR (Tunneling MagnetoResistive) memory, and a CMR (Colossal MagnetoResistive) memory.

The GMR memory element has at least two ferromagnetic layers and a non-magnetic conductor layer interposed therebetween. As the GMR memory element is based on whether the magnetization across the two ferromagnetic layers is in parallel or not, its GMR effect can be sustained.

TMR memory element has at least two ferromagnetic layers and an insulating non-magnetic layer interposed therebetween. The insulating non-magnetic layer is arranged to flow a tunneling current between the two ferromagnetic layers. The ferromagnetic layers produce a magnetoresistive effect due to a spin polarization tunneling current running through the insulating non-magnetic layer between the two ferromagnetic layers. The electric resistance in the TMR memory element depends on whether the magnetization across the ferromagnetic layers is in parallel or not.

The CMR memory element employs a thin film material having a perovskite (La(Sr)MnO) structure which provides a CMR effect greater in resistance change than a GMR effect.

It is said that the RRAM is a type of MRAM because its RRAM memory element as a variable resistance element provides a magnetoresistive effect. The variable resistance element in the RRAM has a PrCaMnO-based CMR layer of which the magnetoresistive effect is different in the principles from that of a TMR layer in the MRAM.

FIG. 14 illustrates a section of a conventional MRAM memory cell array where a TMR memory element is implemented with the use of a spin injection method. In the figure, two memory cells are shown for simplicity. Actually, the memory cells are arranged in rows and columns and connected with signal lines including, for example, word lines WL, bit lines BL, and common source lines SL, as shown in FIGS. 16 and 17. In this case, the MRAM memory is implemented with a P-substrate (P-well), where a first BL is operatively coupled to the P-substrate via a first TMR memory element and a first N+ diffusion region on the left hand side, and a second BL is operatively coupled to the P-substrate via a second TMR memory element and a second N+ diffusion region on the right hand side. In addition, the SL is operatively coupled to the P-substrate through a third N+ diffusion region in the middle. The spin injection method allows the magnetization to be inverted directly by a current supplied to the TMR memory element. When the current supplied to the TMR memory element is reversed (in the feed/draw direction), the magnetization in the free layer shifts to in parallel or not in parallel with the magnetization of the fixed layer. The spin feed method is so called because the magnetization is inverted by the action of spin polarized electrons in the current (See "Nikkei Electronics" 1–20 in 2003, No. 839, pp. 98–105).

FIG. 15 illustrates a section of a conventional RRAM memory cell array where a CMR memory element is implemented with the use of a voltage pulse applying method. In the figure, two memory cells are shown for simplicity. Actually, the memory cells are arranged in rows and columns and connected with signal lines including, for example, word lines WL, bit lines BL, and common source lines SL, as shown in FIGS. 16 and 17. Similarly, the RRAM memory is implemented with a P-substrate (P-well), where a first BL is operatively coupled to the P-substrate via a first TMR memory element and a first N+ diffusion region on the left hand side, and a second BL is operatively coupled to the P-substrate via a second TMR memory element and a second N+ diffusion region on the right hand side. In addition, the SL is operatively coupled to the P-substrate through a third N+ diffusion region in the middle. The magneto-resistive effect of the CMR memory element is different in the principles from that of a TMR layer used in common MRAM.

The storage of data can be implemented by the fact that when the CMR memory element in RRAM is loaded with a pulsed voltage, its resistance changes. The CMR layer is made of, e.g., PCMO ($Pr_{0.7}Ca_{0.3}MnO_3$). The relationship between supplied voltage and resistance is specifically disclosed in "Novel colossal magneto-resistive thin film nonvolatile resistance random access memory", IEDM, 2002, pp. 193–196. The materials for RRAM memory are depicted in U.S. Pat. No. 6,473,332.

The CMR memory element in RRAM is as simple as having a CMR layer disposed between the upper electrode (Pt) and the lower electrode (Pt). As shown in FIGS. 14 and 15, the RRAM memory cell with the voltage pulse applying method and the MRAM memory cell with the spin injection method are equally expressed by an equivalent circuit. The conventional memory cell array shown in FIGS. 14 and 15 has a single memory cell of either MRAM or RRAM implemented by a series circuit of a memory element 1 and a selection transistor 2 where the memory element 1 is directly connected at one end to a bit line BL.

As best shown in FIG. 16, the reset operation (for deleting data) of RRAM is carried out with the supply of voltages, 7 V to the selected word line WLs, 0 V to the non-selected word line WLu, and 0 V to the selected bit line BLs, while the common source line SL is loaded with a pulsed voltage which has a pulse width of substantially 1000 ns and is shifted from 0 V to 5 V and then to 0 V. After the reset operation, the resistance of RRAM memory element becomes low (about 4 kΩ, see FIG. 18). The low resistance represents a storage of data "1". As shown in FIG. 17, the write operation of RRAM is carried out with the supply of voltages, 7 V to the selected word line WLs, 0 V to the non-selected word line WLu, and 0 V to the common source line SL, while the selected bit line BLs is loaded with the pulsed voltage which has a pulse width of substantially 1000 ns and is shifted from 0 V to 5 V and then to 0 V. After the write operation, the resistance of RRAM memory element becomes high (about 140 kΩ, see FIG. 18). The high resistance represents a storage of data "0". If the width of a pulse supplied to the RRAM memory element is increased (for example, to 2000 ns or longer), the resistance will be declined. The relationship between applied voltage and resistance in RRAM memory is disclosed in "Nikkei Electronics", 1–20 in 2003, No. 839, p. 105.

MRAM with the spin injection method is differentiated from RRAM by the fact that a pulsed current is used instead of a pulsed voltage. When the pulsed current but not the pulsed voltage is reversed (in the feed/draw direction), the magnetization in the free layer is shifted to in parallel or not in parallel to the magnetization of the fixed layer, thus switching the resistance of the MRAM memory element from high to low or vice versa. Both the RRAM memory element with the pulsed voltage application method and the MRAM memory element with the spin injection method are as small in the size as DRAM and also compatible with a multi-bit system, hence decreasing the cost per storage size.

Also, conventional MRAM and RRAM memories permits each memory element to be connected directly to the bit lines. It is however true that the memory element (at TMR or CMR layer) is adversely affected when the potential at the bit line is fluctuated by the effect of system noise or any other fault abruptly generated during the startup or energization. When the bit line is loaded with a pulsed voltage or a potential for conducting a current, the memory element in a non-selected memory cell receives the voltage or potential. The voltage and current received by the bit line may affect the resistance and if worse, interrupt the data stored in the memory element of the non-selected memory cell.

More particularly, when the bit line is loaded with 0 V at the standby mode, its potential is 0 V as well as the N+ diffusion potential under the TMR layer shown in FIG. 14. Then, when the bit line receives a current for reading or writing of data, the not selected TMR layer connected directly with the bit line is also affected by charging and discharging currents running in the direction of N+ diffusion across the memory element. As the charging and discharging currents run several times through the TMR layer in the non-selected memory cell, they may interrupt the data stored in the MRAM, which stores the data "0" or "1" by the current direction, hence declining the reliability of data storage.

Similarly, when the bit line is loaded with 0 V at the standby mode in RRAM, its potential is 0 V as well as the N+ diffusion potential under the CMR layer shown in FIG. 15. Then, when the bit line receives a pulsed voltage for reading or writing of data, the not selected CMR layer connected directly with the bit line is also affected by charging and discharging currents running transiently in the direction of N+ diffusion across the memory element. This causes a potential (voltage) between both ends of the CMR layer. As the charging and discharging currents run several times through the CMR layer in the non-selected memory cell, they may interrupt the data stored in the RRAM, which stores the data "0" or "1" by the voltage application direction, hence declining the reliability of data storage.

In addition, when the length of a pulse to be applied is increased (for example, to 2000 ns or longer), the resistance of the RRAM memory increases to a maximum and then decreases. It is therefore necessary for compensation to carefully control the pulsed voltage.

Moreover, the resistance of the RRAM memory element is turned to low (4 kΩ) as the reset operation has been completed. This causes the memory cell to receive a large amount of current depending on the behavior of the reset operation. When the reset operation is carried out on the basis of bytes, the memory element in the non-selected memory cell connected to the non-selected bit line at the floating state receives a transient charging or discharging current like that at the write operation and may suffer from an abundance of voltage/current.

When the resistance of its memory element is declined too low after the reset operation, the memory cell needs to receive a greater level of current during the write operation. It is hence necessary to increase the ability of a driver circuit for supplying the memory cell with a pulsed voltage/current at the write operation. A large size of the driver circuit will thus be provided. For storage of data, a group of the memory cells to be written are held at the low resistance state (about 4 kΩ, see FIG. 18). Since the common source line receives a sum of input currents to the memory cells of the group at the start of the write operation, its size in the cross section has to be increased. As the write operation proceeds, the resistance of each memory element is increased from its low level. It may hence be troublesome to determine the width of a pulse in the pulsed voltage at the write operation.

Furthermore, the reset operation for a group of memory cells is hardly uniform. It is true that the memory elements in the memory cells of a group to be reset are not identical in the resistance but range from higher to lower at inconsistency. Even when the reset operation is triggered under the same conditions, the memory elements may be varied more or less in the resistance.

SUMMARY OF THE INVENTION

The present invention has been made in view of the above problems and its object is to provide a nonvolatile semiconductor memory device which can eliminate the foregoing problems and minimize the stress of voltage and current over the variable resistance element in each non-selected memory cell during the write operation and the reset operation, thus improving the reliability in data retention characteristics.

For achievement of the object of the present invention, a nonvolatile semiconductor memory device has each memory cell arranged where the source line and the bit line in a conventional construction are exchanged by each other. In brief, its variable resistance element employs a memory cell structure connected not directly to the bit line. Also, the reset operation can be conducted in each sector which includes two or more memory cells connected to the common source line.

More specifically, a nonvolatile semiconductor memory device according to the present invention comprises: an array of nonvolatile memory cells arranged in both rows and columns; and a combination of word lines and bit lines arranged to extend in the row and column directions respectively so that they can select one of or a group of the memory cells for operation. The nonvolatile semiconductor memory device has the following features. First, the memory cell has a variable resistance element, in which data is stored through a change in electric resistance, connected at one end to a source of a selection transistor, and the selection transistor is connected at a drain to the bit line extending commonly along the column direction and at a gate to the word line extending commonly along the row direction while the variable resistance element is connected at the other end to a source line in the memory cell array. Second, a write operation on the memory cell is electrically executed by a predetermined voltage supplied to the selected word line to turn the selection transistor conductive and a predetermined writing voltage or current applied between the selected bit line and the selected source line. Third, a reset operation on the memory cell is electrically executed on the sector-by-sector basis, each sector including the plurality of memory cells connected to the common source line, by a predetermined voltage applied to the selected word line to turn the selection transistor conductive and a predetermined resetting voltage or current applied between the selected bit line and the selected source line.

Using the above construction, unwanted current or voltage components which are received from the bit line by the variable resistance element in each non-selected memory cell during the read operation or the write operation can be eliminated thus preventing the stored data in the non-selected memory cell from being disturbed. It is true that the above construction allows the variable resistance element to be connected directly to the source line. In a common large capacity nonvolatile memory, the write operation is controlled bit-by-bit while the reset operation is based on a group. Therefore, since two or more of the memory cells are grouped as a sector for the reset operation, common disturbances occurred at the reset operation will be negligible. Consequently, the above construction can eliminate such disturbances at each of the read operation, the write operation and the reset operation with giving no particular restriction on the reset operation.

The nonvolatile semiconductor memory device may preferably be modified in which the reset operation is executed by a pulsed form of the resetting voltage or current applied to the selected source line while the selected bit line is fixed at the resetting potential or in which the reset operation is executed by a pulsed form of the predetermined voltage applied to the selected word line while the selected bit line and the selected source line are fixed at their respective resetting potentials.

Accordingly, the reset operation can be executed on the memory cell in the device of the present invention without disturbances. Particularly, the latter case allows the duration of time for applying the pulsed input to be controlled with the pulse width at the word line during either the write operation or the reset operation. As a result, the time-controlled circuitry construction will be simplified with no use of a pulse generator circuit at the source line side for the reset operation.

The nonvolatile semiconductor memory device may preferably be modified in which the sector is divided into sub-sectors, and the reset operation is executed in a time-division manner for each sub-sector. Also, it may be modified in which the sub-sector to be subjected to the reset operation is determined by selecting the bit line connected to the memory cell in the sub-sector. It may further be modified in which the sub-sector to be subjected to the reset operation is determined by holding at the resetting potential the bit line connected to the memory cell in the sub-sector, whereby the sub-sector connected to the memory cell in the sub-sector will be at the floating state thus to allow no selection of the other sub-sectors.

It may still preferably be modified in which the reset operation is intended to lower the electric resistance of the memory cell, and the resistance of the memory cell in the sub-sector to be subjected to a time-division manner of the reset operation is controlled to stay not lower than a lower limit level.

As the reset operation is carried out in a time-division manner at each sub-sector, its instantaneous current at the startup can be controlled. Accordingly, the circuitry construction for generating the reset operation voltage can be decreased in the size and the cross section of the source lines can be reduced, hence minimizing the chip size and thus the production cost.

The nonvolatile semiconductor memory device may be modified in which the action of lowering the electric resistance of the memory cell in the write operation or the reset operation is canceled when the resistance value of the memory cell is found lower than a reference level through comparison between the resistance value of the memory cell and the reference level during the action. This allows the resistance value of the memory cell to be controlled at higher accuracy.

Also, it may preferably be modified in which the reset operation is intended to lower the electric resistance of the memory cell, and the reset operation is preceded by a verify operation for examining whether or not the resistance of each memory cell to be subjected to the reset operation is lower than the reference level and when the every resistance is lower than the reference level, the reset operation is not started. This can prevent undesired version of the reset operation thus minimizing the required duration of time and the power consumption at the reset operation.

It may further preferably be modified in which the reset operation is intended to lower the electric resistance of the memory cell, the reset operation is preceded by a first verify operation for examining whether or not the resistance of each memory cell to be subjected to the reset operation is lower than a first reference level, and when it is found that the every resistance is lower than the first reference level, a second verify operation is conducted for examining whether or not the resistance of the memory cell is higher than a second reference level and if the every resistance is higher than the second reference level, the reset operation is not started.

It may still further be modified in which when it is found in the second verify operation that at least one of the resistances is not higher than the second reference level, the write operation is conducted on the memory cell of which the reference is not higher than the second reference level under a writing condition that the resistance stays higher than the second reference level and lower than the first reference level. This can prevent unwanted version of the reset operation thus minimizing the required duration of time and the power consumption at the reset operation. In addition, the resistance can precisely be controlled during the reset operation.

It may further be modified in which the reset operation is intended to lower the electric resistance of the memory cell, and the reset operation is preceded by the write operation for raising the resistance of the memory cell to be subjected to the reset operation. This allows the memory cells in the sector to be subjected to the reset operation to be substantially uniform in the resistance, hence simplifying the control action for triggering the reset operation. Also, unwanted variations in the resistance of each memory cell after the reset operation can be eliminated.

It may further preferably be modified in which the write operation is intended to raise the electric resistance of the memory cell, and the write operation is controlled so that it stops before the resistance of the memory cell reaches a maximum during the write operation. It may also be modified in which the resistance of the memory cell during the write operation is compared with a write operation reference level predetermined to not higher than the maximum and the write operation is controlled to stop before the resistance of the memory cell during the write operation reaches the maximum.

It may still further be modified in which the resistance of the memory cell during the write operation is compared with a write operation reference level predetermined to not higher than the maximum and the duration of time where the writing voltage is being applied or the number of applications of the writing voltage for allowing the resistance of the memory cell during the write operation to reach the maximum is stored in an embedded nonvolatile memory area.

Accordingly, the above modifications can prevent the resistance from being declined as the write operation proceeds, and thus maintain the margin of the read operation. Particularly, the second modification permits the resistance to remain not lower than the lower limit at the write operation thus ensuring a margin for action. Also, the third modification can determine the lower limit at each device thus improving the margin for action.

It may also be modified in which the write operation is intended to raise the electric resistance of the memory cell, and the memory cells to be subjected to the write operation is divided into groups and the write operation is executed in a time-division manner on the group-by-group basis at least at the first application of the writing voltage. Moreover, it may preferably be modified in which as the write operation proceeds, the group is modified to increase the number of the memory cells in the group.

Accordingly, the instantaneous current received by the memory cell at the lower level of the resistance in the write operation or particularly at the startup of the write operation can successfully be controlled. Hence, the circuitry construction for generating the write operation voltage as well as the source circuit for generating the memory cell current for the write operation can be settled to an acceptable size. In particular, the latter allows the duration of time for the write operation, which may be sacrificed by the former modification, to be successfully decreased thus minimizing the power consumption at the write operation with the use of a minimum length of the writing time.

It may further preferably be modified in which the write operation and the reset operation are executed in response to command data received at a dedicated input terminal or input/output terminal. This allows the write operation and the reset operation to be controlled with common commands used with a conventional flash memory. Accordingly, in a system using the nonvolatile semiconductor memory device of the present invention, the flash memory of command type can be replaced with ease.

It may still preferably be modified in which the write operation and the reset operation employ reference levels which are determined by the same variable resistance element as in the memory cell for verifying or comparing the resistance of the memory cell. This allows the reference level of the resistance to be finely adjusted at each device thus contributing to the high performance of the storage apparatus.

Preferably, the nonvolatile semiconductor memory device may further comprises: a plurality of source terminals including dedicated source terminals for use with the write operation and the reset operation, wherein the operating current received by the memory cell in the write operation or the reset operation is supplied from a source current through the dedicated terminal. This permits the current input to be backed up in case that a large number of the memory cells are subjected at once to the write operation and the reset operation, thus contributing to the high performance of the storage apparatus.

It may then preferably be modified by further comprising: a bit line discharging circuit for connecting the bit line with a ground potential at the standby state where none of the read operation, the write operation, and the reset operation on the memory cell is conducted. This allows the bit line to be securely held at the ground potential at the standby state, avoiding the generation of abrupt disturbance and thus improving the storage of data.

It may still preferably be modified by further comprising: a comparator for comparing the resistance of the memory cell with its reference level, the comparator connected at one of two inputs to a set of reference resistors via a reference resistance selecting circuit, the reference resistors providing reference levels for use with the read operation, the write operation, the reset operation, and a testing action on the memory cell; and a reference resistance writing circuit for setting the reference resistors to desired resistance levels. This allows the memory cell to be tested under more strict conditions than those at the read operation, the write operation, and the reset operation, hence maintaining the reliability as well as the performance of the storage apparatus at higher level.

It may also preferably be modified in which the memory cell is arranged to be at a data protection state where the write operation and the reset operation are inhibited at least for each sector. This can prevent undesired rewriting of the stored data. In addition, the reset operation can be controlled with much ease because the data protection is determined by the unit of a sector which is identical for the reset operation.

It may further preferably be modified in which the variable resistance element is fabricated using a CMR (Colossal Magneto-Resistive) layer or a TMR (Tunneling Magneto-Resistive) layer. It may also be modified in which the variable resistance element is made of an oxide having a perovskite structure containing manganese.

Accordingly, the variable resistance element can be supplied with a pulsed voltage or current for replacing its stored data. Particularly, the latter construction can favorably be operated with an RRAM format using a pulsed voltage application method while the generation of disturbances is minimized. The CMR layer may be fabricated by an MOCVD, spin coating, laser abrasion, or sputtering method of any oxide manganese compound selected from $Pr_{(1-x)}Ca_xMnO_3$, $La_{(1-x)}Ca_xMnO_3$, and $La_{(1-x-y)}Ca_xPb_yMnO_3$ (where x<1, y<1, and x+y<1) including $Pr_{0.7}Ca_{0.3}MnO_3$, $La_{0.65}Ca_{0.35}MnO_3$, and $La_{0.65}Ca_{0.175}Pb_{0.175}MnO_3$.

DETAILED DESCRIPTION OF THE INVENTION

Hereinafter, description will be given of embodiments of a nonvolatile semiconductor memory device according to the present invention (hereinafter, appropriately referred to as "inventive device") with reference to the drawings. Like components are denoted by like numerals throughout the embodiments of the inventive device as well as a conventional nonvolatile semiconductor memory device.

FIRST EMBODIMENT

Figure 1:
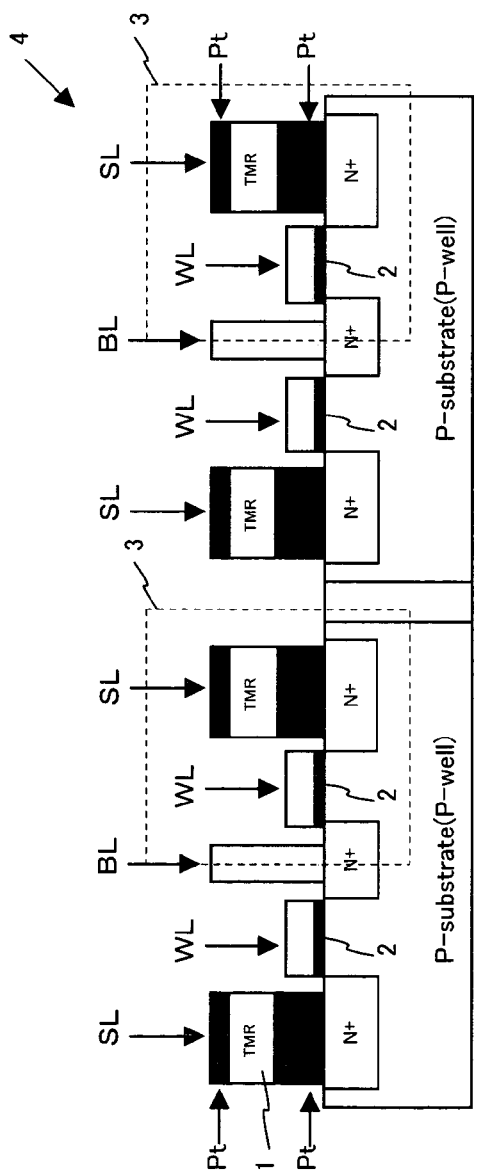
FIG. 1 is a circuit diagram showing a memory cell construction of an MRAM format with a spin injection method in a nonvolatile semiconductor memory device according to the present invention.
Figure 1:
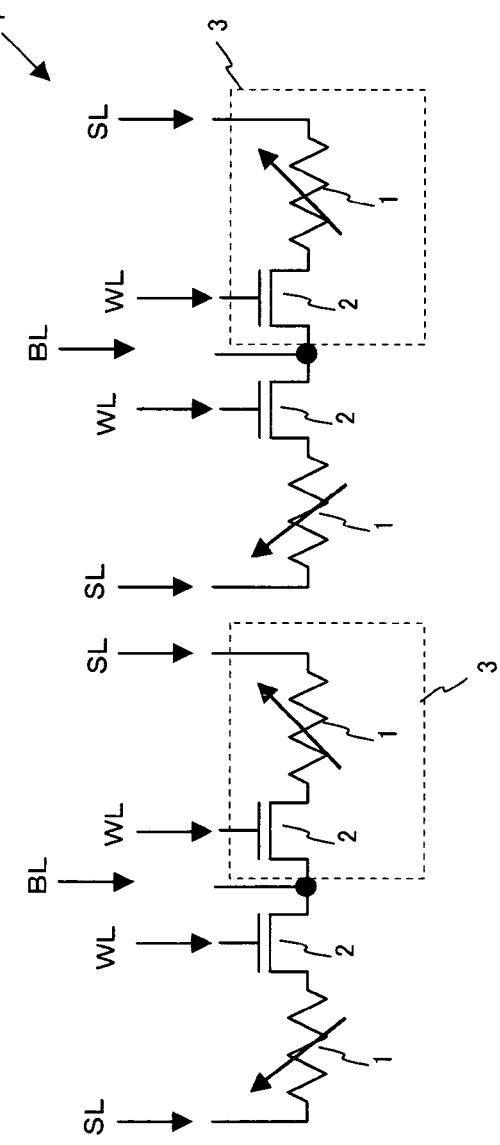

FIG. 1 illustrates a memory cell construction of the inventive device according to a first embodiment. A plurality of memory cells 3 are arranged in an array form of rows and columns to form a memory cell array 4 shown in FIG. 4. The inventive device in the first embodiment is provided in the form of an MRAM with the spin injection method. The memory cell 3 has a construction in that, as shown in FIG. 1, one end of a variable resistance element 1 including a TMR layer and a source of a selection transistor 2 are connected to each other to form a series circuit; a bit line BL is not directly connected to the variable resistance element 1, but is connected to a drain of the selection transistor 2; and a source line SL is connected to the other end of the variable resistance element 1. In the memory cell array, the bit line BL is commonly connected to the drains of the selection transistors 2 aligned along the column direction, the source line SL is commonly connected to the other ends of the variable resistance elements 1, and the selection transistors 2 are connected at gates to a common word line WL which extends along the row direction. In this case, each MRAM memory is implemented with a P-substrate (P-well), where a first BL is operatively coupled to the P-substrate via a first TMR memory element and a first N+ diffusion region on the left hand side, and a second BL is operatively coupled to the P-substrate via a second TMR memory element and a second N+ diffusion region on the right hand side. In addition, the SL is operatively coupled to the P-substrate through a third N+ diffusion region in the middle.

Figure 2:
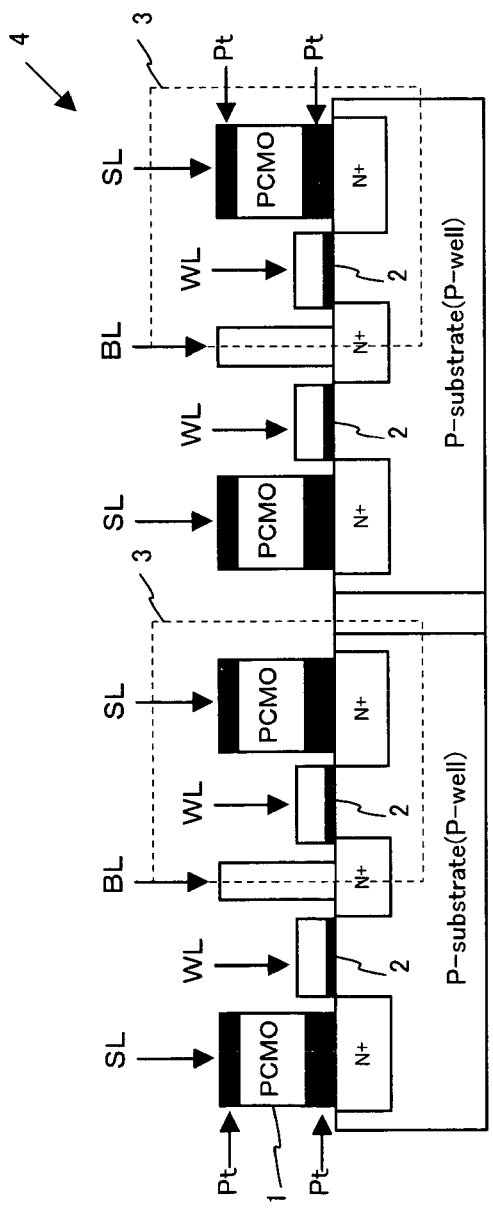
FIG. 2 is a circuit diagram showing a memory cell construction of an RRAM format with a voltage application method in a nonvolatile semiconductor memory device according to the present invention.
Figure 2:
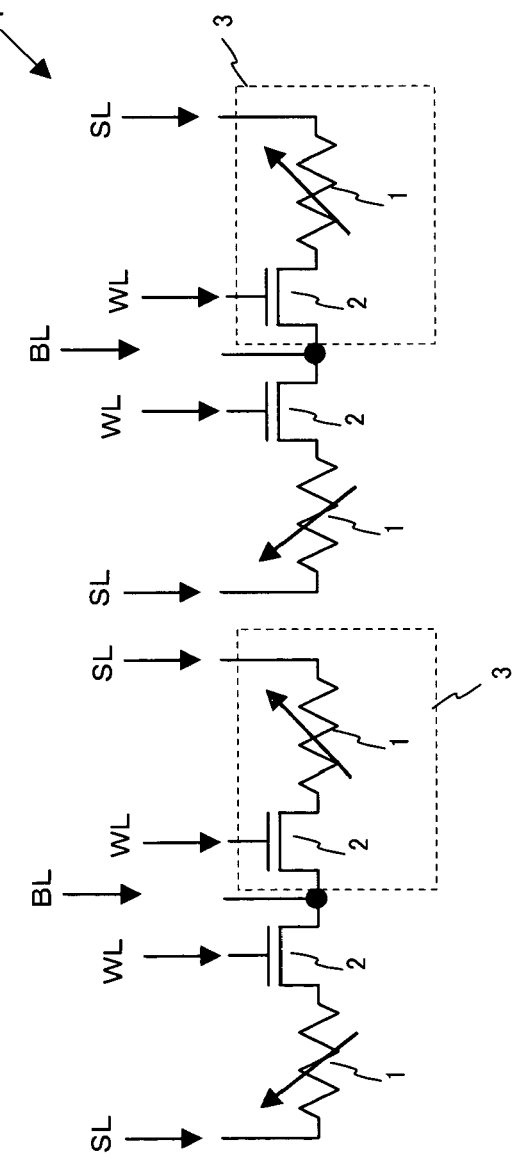

FIG. 2 illustrates another memory cell construction of an RRAM showing a modification of the first embodiment. The memory cell 3 of the RRAM like that of the MRAM shown in FIG. 1 has a construction in that one end of the variable resistance element 1 including a CMR layer and the source of the selection transistor 2 are connected to each other to form the series circuit; the bit line BL is not directly connected to the variable resistance element 1, but is connected to the drain of the selection transistor 2; and the source line SL is connected to the other end of the variable resistance element 1. In the memory cell array 4, the bit line BL is commonly connected to the drains of the selection transistors 2 aligned along the column direction, the source line SL is commonly connected to the other ends of the variable resistance elements 1, and the selection transistors 2 are connected at the gates to the common word line WL which extends along the row direction. Similarly, each RRAM memory is implemented with a P-substrate (P-well), where a first BL is operatively coupled to the P-substrate via a first TMR memory element and a first N+ diffusion region on the left hand side, and a second BL is operatively coupled to the P-substrate via a second TMR memory element and a second N+ diffusion region on the right hand side. In addition, the SL is operatively coupled to the P-substrate through a third N+ diffusion region in the middle.

The memory cell construction shown in FIG. 1 can prevent the variable resistance element 1 (at the TMR or CMR layer) from being affected directly by any system noise which is abruptly generated at the startup or energization of the device and fluctuates the potential on the bit line BL. Also, the variable resistance element 1 in a non-selected memory cell can be inhibited from receiving any unwanted voltage when the bit line BL is loaded with a pulsed voltage or a potential for conducting a current at the read or write operation, hence hardly allowing its resistance to be varied by the effect of unwanted voltage or current and thus the data stored in the non-selected memory cell to be unfavorably modified.

The RRAM in the first embodiment will be further described with reference to FIGS. 3 and 4. It is assumed that a word line WL to be connected to the selected memory cell(s) 3 for the write or reset (erase) operation is called a selected word line WLs while a non-selected word line is denoted by WLu. Similarly, a bit line BL to be connected to the selected memory cell(s) 3 is called a selected bit line BLs while a non-selected bit line is denoted by BLu. A source line SL to be connected to the selected memory cell(s) 3 is called a selected source line SLs while a non-selected source line is denoted by SLu. The selected word line WLs, the selected bit line BLs and the selected source line SLs are determined by a known technique used for common semiconductor memories where an address input signal is decoded.

Figure 3:
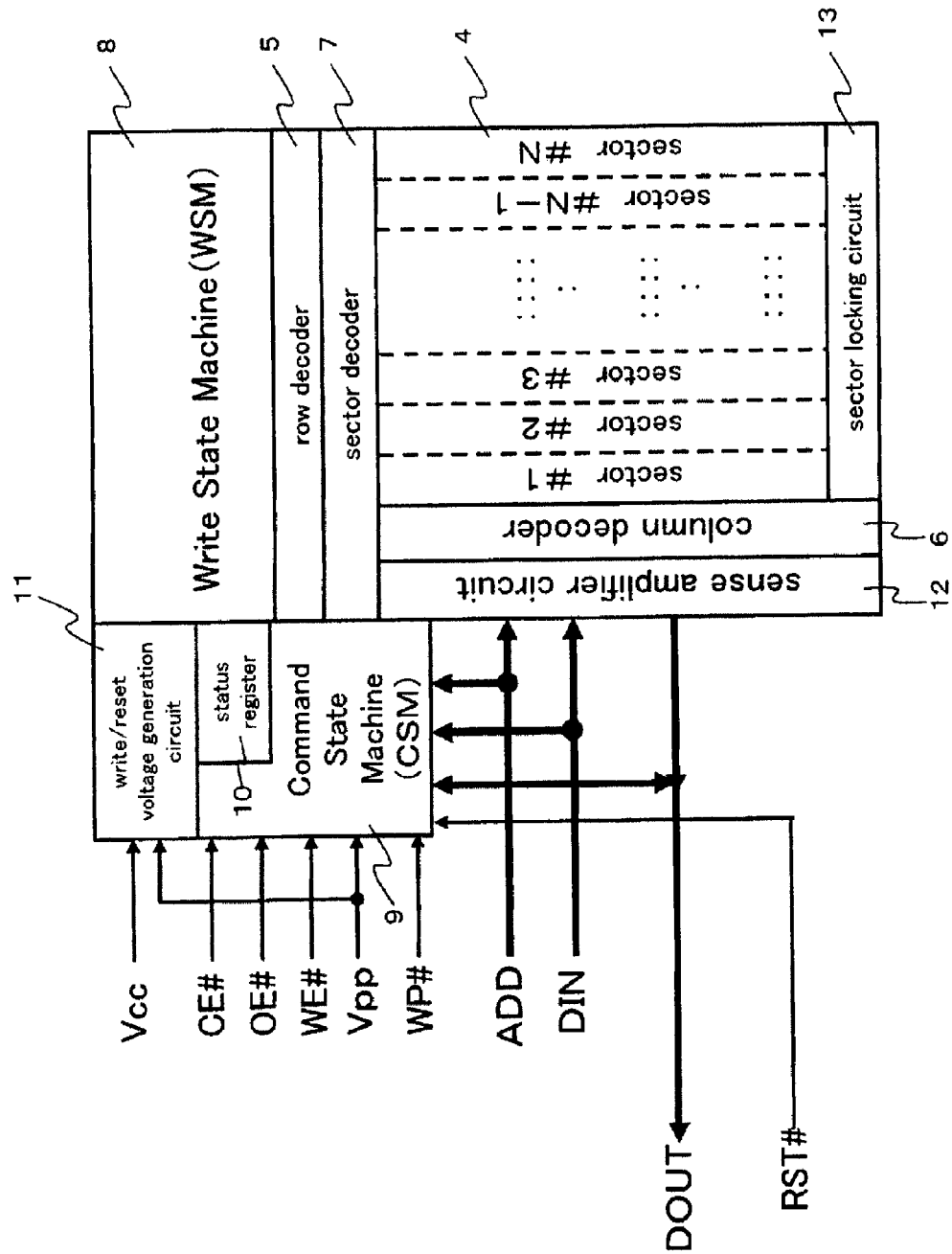
FIG. 3 is a schematic block diagram of a circuitry construction of the nonvolatile semiconductor memory device according to the present invention.

FIG. 3 is a schematic block diagram of the inventive device. The inventive device comprises the memory array 4, a row decoder 5, a column decoder 6, a sector decoder 7, a write state machine (WSM) 8, a command state machine (CSM) 9, a status register 10, a write/reset voltage generation circuit 11, a sense amplifier circuit 12, and a sector locking circuit 13. The construction is substantially equal to that of a common flash memory. Also not shown are an input circuit for an address input ADD, a data input DIN, various control inputs CE#, OE#, WE#, WP#, RST# and an output circuit for a data output DOUT. In addition, Vcc is an input signal to the write/reset voltage generation circuit 11, and Vpp is an input signal to the command state machine 9.

The row decoder 5 is provided for determining the selected word line WLs and feeding a voltage to the selected and non-selected word lines WLs and WLu for carrying out the write operation, the reset operation or the read operation. The column decoder 6 is provided for determining the selected bit line BLs and feeding a voltage to the selected and non-selected bit lines BLs and BLu for carrying out the write operation, the reset operation or the read operation. The sector decoder 7 is provided for determining the selected source line SLs and feeding a voltage to the selected and non-selected source lines SLs and SLu for carrying out the write operation, the reset operation or the read operation. The write state machine (WSM) 8 is provided for controlling the write operation or the reset operation on the memory cell array 4. The command state machine (CSM) 9 is arranged responsive to a command signal from the data input terminal for reading out a command and instructing the WSM 8 with the command. The status register 10 is provided for storing the state of the WSM 8 at the write operation or the reset operation and releasing out the state from the data output terminal automatically or when requested. The write/reset voltage generation circuit 11 is provided for generating a voltage supplied to the selected word line WLs, the selected bit line BLs and the selected source line SLs for the write operation or the reset operation while energizing the row decoder 5, the column decoder 6 and the sector decoder 7. The sense amplifier circuit 12 is provided for comparing between the resistance value of the variable resistance element 1 in a selected memory cell and the resistance value of a reference memory cell in the memory cell array 4 to read a storage data from the selected memory cell. The sense amplifier circuit 12 is used at the read operation and for verification of the write operation or the reset operation. The sector locking circuit 13 is provided for inhibiting the write operation or the reset operation on the memory cells 3 of each sector in response to the setting of the sector to protect the data on the sector-by-sector basis.

The memory cell array 4 is divided into a plurality (N in the figure) of the sectors. The memory cells 3 in each sector are connected to the common source line SL for allowing the reset operation on the sector-by-sector basis. As the source line SL in each sector is commonly used, it may be called a common source line or a source line.

Figure 4:
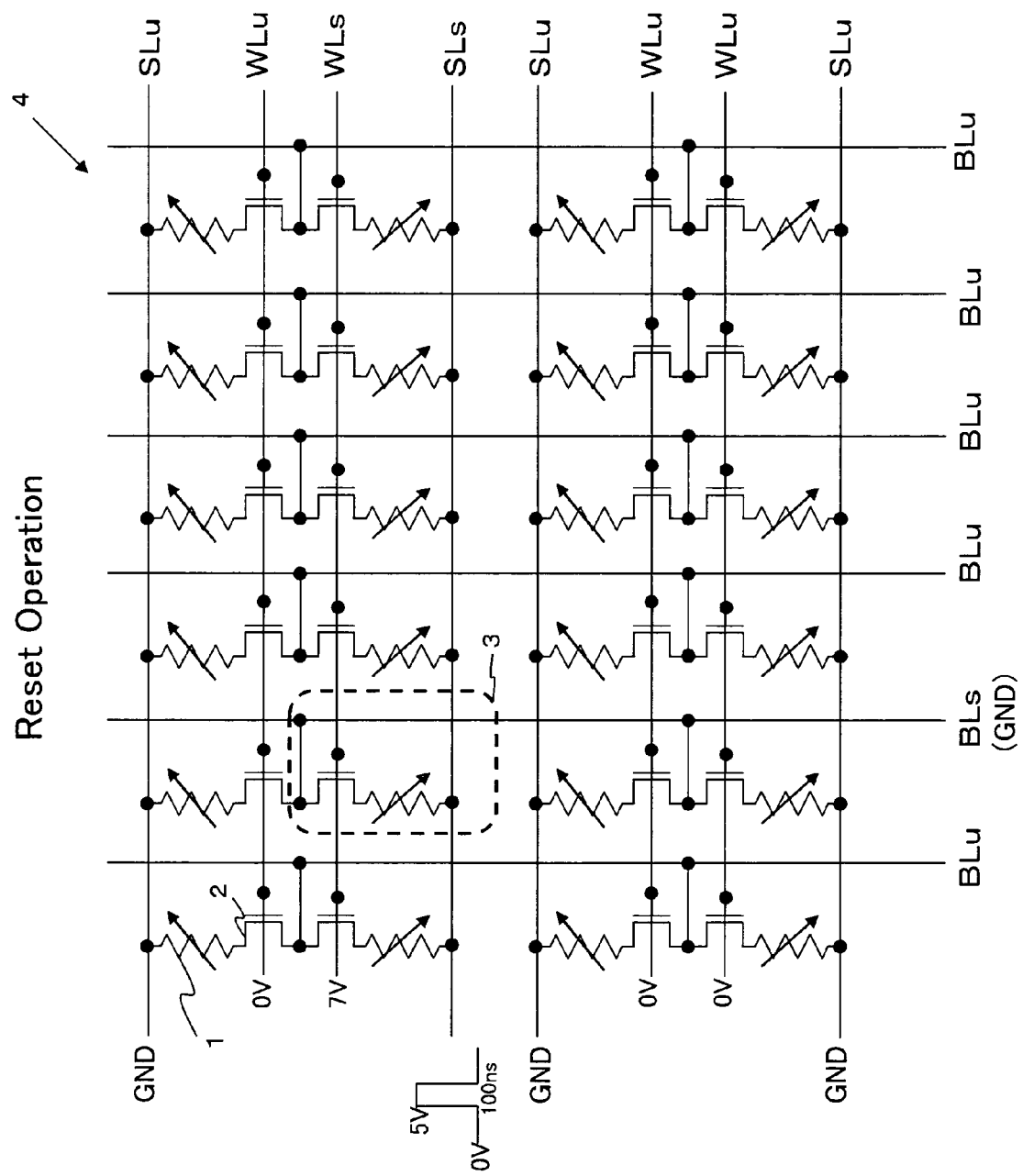
FIG. 4 is a circuit diagram of a memory cell array with voltages applied at a reset operation showing a first embodiment of the nonvolatile semiconductor memory device according to the present invention.
Figure 5:
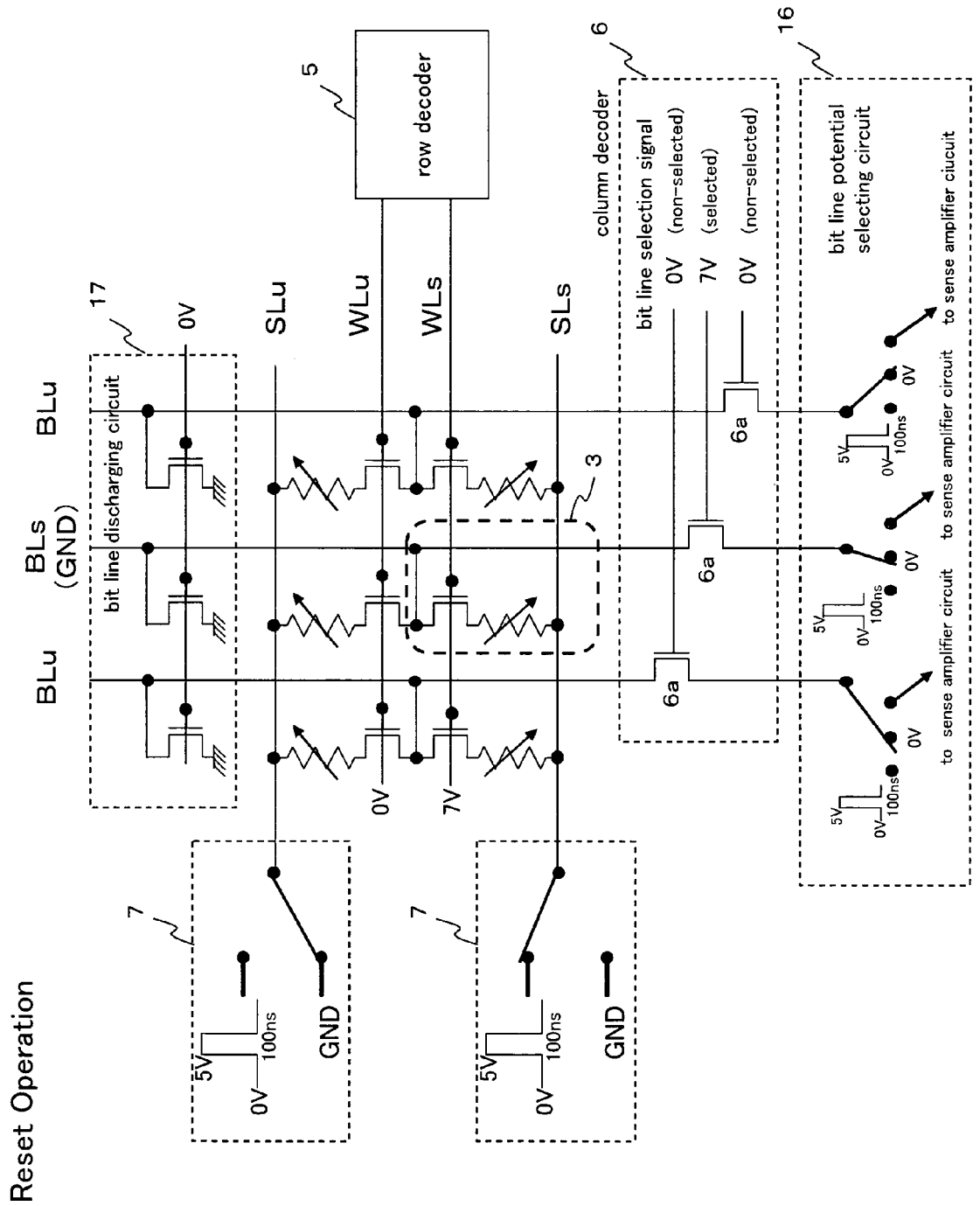
FIG. 5 is a circuit diagram of the memory cell array at the reset operation and its peripherals showing the first embodiment of the nonvolatile semiconductor memory device according to the present invention.

As shown in FIGS. 4 and 5, the reset operation of the first embodiment is carried out with the selected word line WLs supplied with 7 V, the non-selected word line WLu supplied with 0 V, the selected bit line BLs supplied with 0 V, and the selected source line SLs supplied with a pulse voltage which has a pulse width of 1000 ns and is shifted from 0 V to 5 V and then to 0 V. At the time, the non-selected source line SLu is fixed at a ground potential GND and the non-selected bit line BLu is set to a floating state. When the reset operation has been completed, the resistance value of the variable resistance element 1 is turned to a low level (about 4 kΩ) and its represents the storage data "1".

FIG. 5 illustrates the reset operation with the sector decoder 7 and the column decoder 6 with a bit line potential selecting circuit 16 and a bit line discharging circuit 17. The bit line potential selecting circuit 16 and the bit line discharging circuit 17 are illustrated as a function of the column decoder 6 in FIG. 3. At the reset operation, the sector decoder 7 connects the non-selected source line SLu with the ground potential GND (0 V) and the selected source line SLs with the pulsed voltage which shifts from 0 V to 5 V and then to 0 V. The gate 6a of the column decoder 6 for connecting between the bit line BL and the bit line potential selecting circuit 16 is disconnected from the non-selected bit line BLu (0 V at the gate voltage) and connected with the selected bit line BLs (7 V at the gate voltage). The bit line potential selecting circuit 16 is at 0 V at the reset operation thus allowing the selected bit line BLs connected via the gate 6a to remain at the ground potential. The bit line discharging circuit 17 is turned on at the standby state for connecting the bit line BL with the ground potential (0 V) and is turned off for the reset operation. While the non-selected word line WLu is at 0 V, the selected word line WLs receives 7 V of the word line potential from the row decoder 5. For resetting the other memory cell 3 connected with the selected word line WLs, the WSM 8 is actuated to switch the bit line selection signal supplied as a gate input to the gate 6a of the column decoder 6. The number of the memory cells 3 to be reset at the time is determined by the bit line selection signal.

Figure 6:
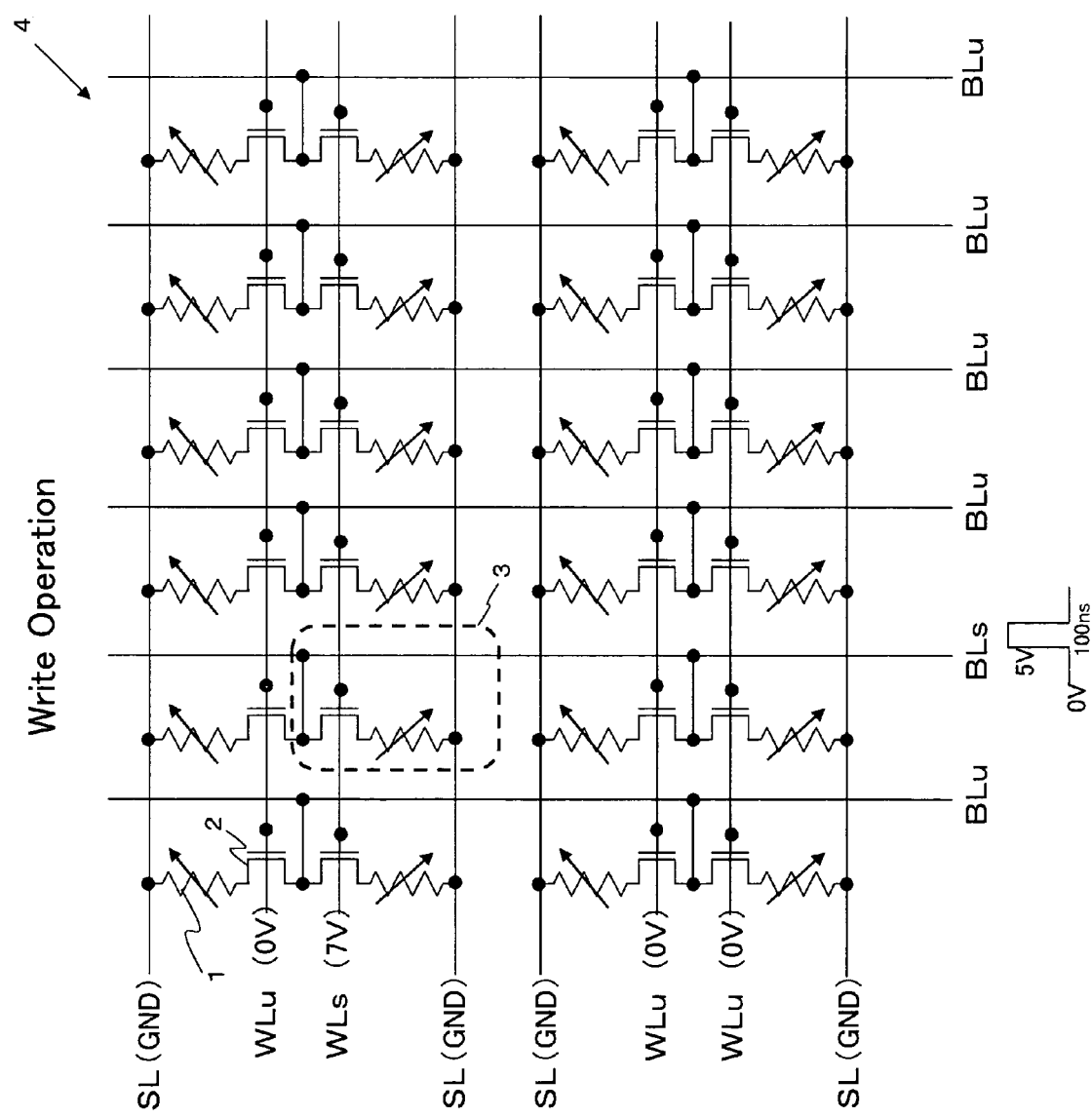
FIG. 6 is a circuit diagram of the memory cell array with voltages applied at a write operation showing the first embodiment of the nonvolatile semiconductor memory device according to the present invention.
Figure 7:
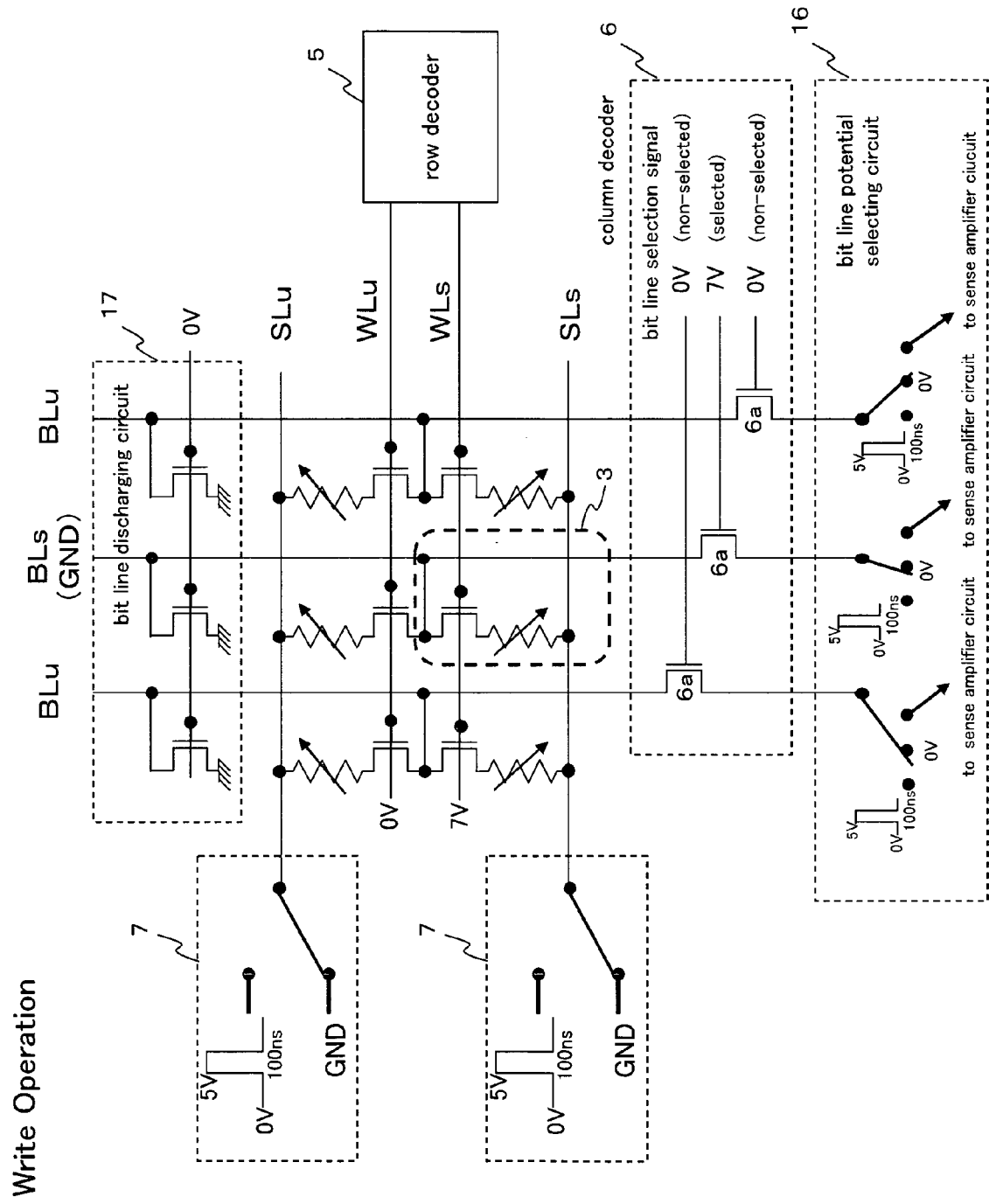
FIG. 7 is a circuit diagram of the memory cell array at the write operation and its peripherals showing the first embodiment of the nonvolatile semiconductor memory device according to the present invention.

As shown in FIGS. 6 and 7, the write operation of the first embodiment is carried out with the selected word line WLs supplied with 7 V, the non-selected word line WLu supplied with 0 V, the selected source line SLs supplied with 0 V, and the selected bit line BLs supplied with a pulse voltage which has a pulse width ranging from 100 ns to 1000 ns and is shifted from 0 V to 5 V and then to 0 V. When the write operation has been completed, the resistance value of the variable resistance element 1 is turned to a high level (about 140 kΩ) and its represents the storage data "0". It is noted that the resistance value of the variable resistance element 1 including the CMR layer is not increased but decreased from its maximum when the pulse width of the pulsed voltage becomes long (about 2000 ns).

FIG. 7 illustrates the write operation with the sector decoder 7, the column decoder 6, the bit line potential selecting circuit 16 and the bit line discharging circuit 17. At the write operation, the sector decoder 7 connects both the selected and non-selected source lines SLs and SLu with the ground potential GND (0 V). The gate 6a of the column decoder 6 is disconnected from the non-selected bit line BLu (0 V at the gate voltage) and connected with the selected bit line BLs (7 V at the gate voltage). The bit line potential selecting circuit 16 connects 0 V for writing the data "1" (holding the resistance at a lower level) and the pulse voltage, which shifts from 0 V to 5 V and then to 0 V, for writing the data "0" (shifting the resistance to a higher level). The bit line discharging circuit 17 is turned on at the standby state for connecting the bit line BL with the ground potential (0 V) and is turned off for the write operation. While the non-selected word line WLu is at 0 V, the selected word line WLs receives 7 V of the word line potential from the row decoder 5.

The inventive device of an MRAM allows the memory cell 3 to be supplied with a pulsed current but not the pulsed voltage for the write operation or the reset operation. As the pulsed current is reversed (in the feed/draw direction), the magnetization in the free layer shifts to in parallel or not in parallel with the magnetization of the fixed layer. As a result, the resistance value of the variable resistance element 1 including the MRAM memory element with the TMR layer is turned to a higher or lower level. As the RRAM and the MRAM are simply differentiated by the fact that the input is either a pulsed voltage or a pulsed current, the inventive device will further be described in the form of the RRAM.

At the reset operation (FIGS. 4 and 5), the selected source line SLs is supplied with the pulsed voltage which has a pulse width of 1000 ns and is shifted from 0 V to 5 V and then to 0 V. This allows all the variable resistance elements 1 connected to the selected word line WLs to receive the pulsed voltage. It is now assumed that the number of the variable resistance elements 1 connected to the selected word line WLs is 512. When the 512 variable resistance elements 1 at the higher level of the resistance (about 140 k$\Omega$) is subjected to the reset operation at once, an instantaneous current of 18 mA (=512×5 V/140 k$\Omega$) runs from the selected source line SLs through the 512 memory cells 3. Then, as the resistance of the variable resistance elements 1 is turned down to a lower level (about 4 k$\Omega$), the instantaneous current becomes higher and finally reaches 640 mA (=512×5 V/4 k$\Omega$).

However, for feeding as a high current as 640 mA of the resetting voltage, the write/reset voltage generating circuit 11 for supplying the selected source line SLs with the resetting voltage via the sector decoder 7 has to include a considerable size of internal pumping circuit. This will increase the overall size and cost of the memory device in a chip form. Also, the high current needs the relevant lines made of a metallic wire increased in the cross section. This will also increase the cost of the memory chip. It is hence preferable that the memory cells 3 are not connected at once with the selected word line WLs but divided into sub-sectors of some bits to bytes for ease of the reset operation so that the instantaneous current is limited to a level which can run through the metallic wire lines in the internal pumping circuit and the source line SL without difficulty. As the internal pumping circuit needs not to be increased in the size, the requirements of increasing the cross section of the metallic wire lines and considering the cost up of the chip will be eliminated.

It is assumed that a sub-sector of one byte (eight cells) is subjected at once to the reset operation. For example, when eight of the variable resistance elements 1 are reset from the higher level of the resistance (about 140 k$\Omega$), the instantaneous current is as small as 0.3 mA (=8×5 V/140 k$\Omega$). Then, as the resistance of the variable resistance elements 1 is turned down to a lower level (about 4 k$\Omega$) by the reset operation, the instantaneous current increases up to 10 mA (=8×5 V/4 k$\Omega$).

When the reset operation is conducted on the basis of 4 bits (4 cells), the instantaneous current is increased up to 5 mA (=4×5 V/4 k$\Omega$) with the resistance of the variable resistance elements 1 being declined to a lower level (about 4 k$\Omega$). In other words, as the number of the memory cells 3 to be reset at once is small, the current at the end of the reset operation can favorably be minimized. When all the 512 memory cells 3 are connected to the source line SL in one sector, they may adversely be disturbed by the pulsed input of 5 V supplied to the selected source line SLs. For compensation, the reset operation is made for each sub-sector where while the bit line connected to the memory cells 3 in each not selected sub-sector remains at the floating state, the bit lines connected to the memory cells 3 in the selected sub-sectors are shifted in a sequence from the floating state to the ground potential for choosing the sub-sectors. This allows the 512 variable resistance elements 1 connected to the selected source line SLs in the sector to be reset in a sequence for each sub-sector. As all the memory cells 3 in the sector are subjected to the reset operation, they can hardly be affected by disturbances at the reset operation. The time required for resetting the 512 memory cells 3 connected to the source line SL on the basis of four bits (four cells) is as short as 64 μs (=512/4×1000 ns).

It is also possible for minimizing the instantaneous current received by the memory cells 3 at the reset operation to increase the lower level of the resistance after the reset operation from about 4 k$\Omega$ to, for example, about 8 k$\Omega$. Accordingly, the requirement for having a large size of the internal pumping circuit and thus hardly decreasing the overall cost or increasing the cross section of the metallic wire lines can be eliminated. For setting the lower level of the resistance to about 8 k$\Omega$, the pulse width is decreased to 200 ns.

The write operation and the reset operation on the memory cell 3 are started by corresponding commands in the inventive device. The write operation is triggered by a program command. The reset operation on the memory cell 3 is triggered by a sector resetting command and carried out for each sub-sector in each sector (512 bytes or 128 bytes).

It is hence necessary for the inventive device executing the read operation, the write operation and the reset operation to receive the corresponding control commands at advance and direct the CSM 9 to read out the commands. For maintaining the data retention characteristic at a high level, the write operation and the reset operation are conducted in an intricate sequence (algorithm) of steps as controlled by the WSM 8. As information about the start and end of the write operation and the reset operation is stored in the status register 10, it can be retrieved and used for acknowledging the current action of the WSM 8.

It is assumed that the status register 10 is an 8-bit register where the bit 7 (the eighth bit) is "1" (ready) when the WSM 8 remains at the standby state in the array reading mode (for a common read operation on the memory cell array 4). When the WSM 8 starts to control the reset operation or the write operation, the bit 7 is turned to "0" (busy). As the reset operation or the write operation has been completed, the bit 7 returns back to "1" (ready) to indicate the end of the operation.

The shifting back from the status register reading mode for reading data from the status register 10 to the array reading mode for reading data from the memory cell array 4 is triggered by an array readout command. Then, the reading of data from the memory cell array 4 is ready in the inventive device. Table 1 shows a list of the commands used in the inventive device.

TABLE 1

| Commands | First writing cycle Data input | Second writing cycle Data input |
| --- | --- | --- |
| Array reading/resetting | FFH | |
| Writing | 40H | Written data |
| Sector resetting | 20H | D0H |
| Status register reading | 70H | |
| Sector locking | 60H | 01H |
| Sector unlocking | 60H | D0H |

For example, the array read operation of the inventive device starts with receiving the command "FFH" (wherein "H" indicates that data is of a hexadecimal form) from the data terminal (commonly used for both input and output of data). When the chip enable signal CE# and the output enable signal OE# (wherein "#" represents a type of signal which turns active when the input is at low level) become active, the reading of data from the memory array cell 4 starts. As a predetermined time of length has passed from the start, the data stored in an address area specified by the input received at the address input terminal of the memory cell array 4 is read out and released from the data terminal.

For directing the inventive device to receive the control commands, codes corresponding to the control commands listed in Table 1 are entered to the data terminal and, simultaneously, the chip enable signal CE# and the write enable signal WE# are turned active.

The sector locking circuit 13 shown in FIG. 3 may be a latch circuit for latching the information about locking each sector. When the inventive device receives a sector lock command, the sector locking circuit 13 latches its latching circuit with "1" thus to inhibit the writing operation and the reset operation on the selected sector. Upon a sector unlock command being received, the sector locking circuit 13 resets its latching circuit with "0" to unlock and allow the write operation and the reset operation on the selected sector.

Figure 8:
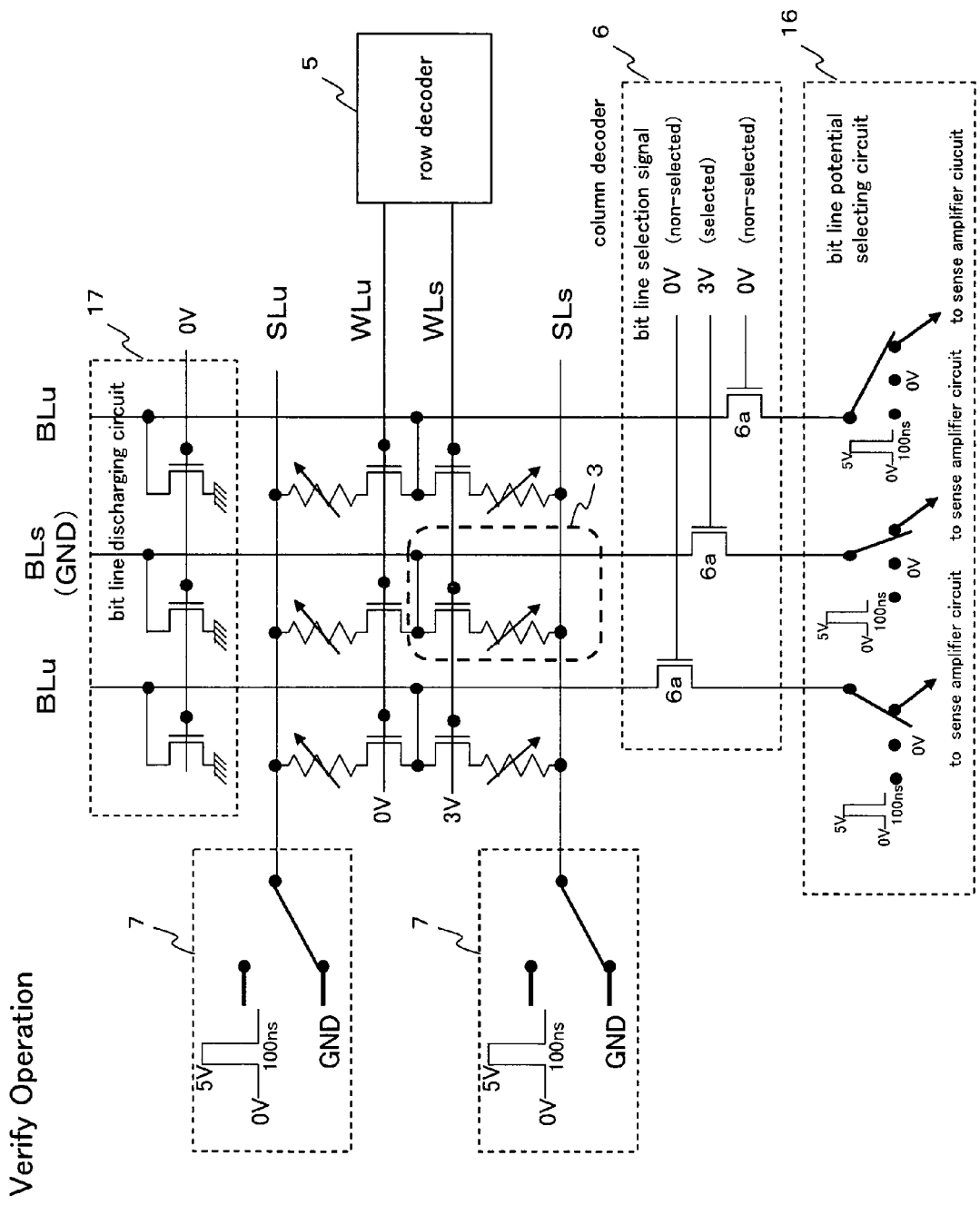
FIG. 8 is a circuit diagram of the memory cell array at a verify operation or a read operation and its peripherals showing the first embodiment of the nonvolatile semiconductor memory device according to the present invention.
Figure 9:
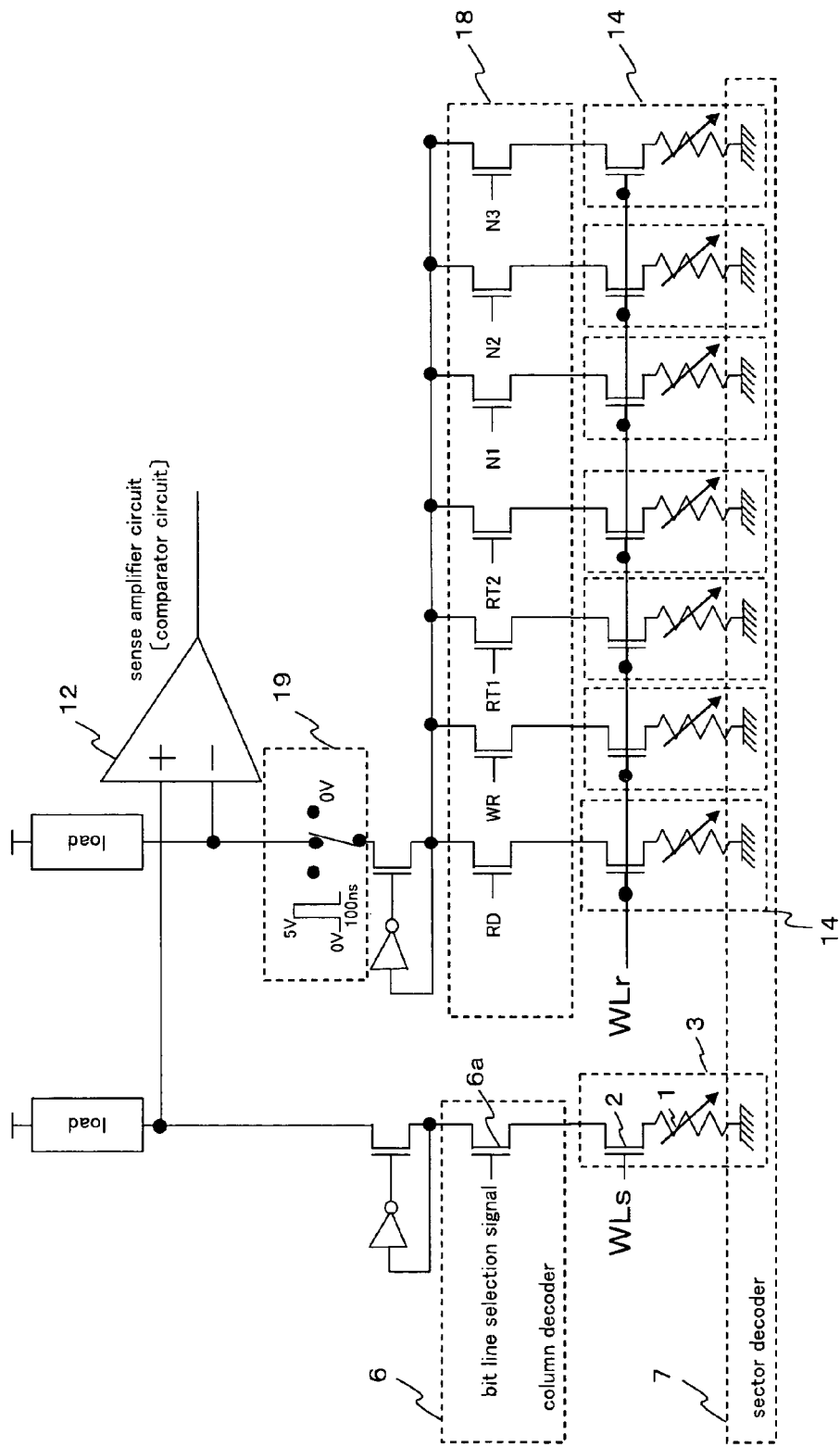
FIG. 9 is a schematic circuit diagram of a sense amplifier circuit showing the nonvolatile semiconductor memory device according to the present invention.

More specifically, when a sector reset command from the outside is received by the CSM 9, the WSM 8 applies the selected word line WLs in the selected sector with 7 V, connects the selected bit line BLs in the selected sub-sector of one byte (8 bits) to the ground potential, and allows the selected source line SLs to be energized by a pulsed voltage which has a width of 1000 ns and shifts from 0 V to 5 V and then to 0 V (or by 10 times the 100 ns width pulsed voltage) in order to reset one byte of the memory cells 3. This is followed by connecting the selected bit line BLs in the sub-sector of one byte (8 bits) at the next address with the ground potential and supplying the selected source line SLs with the pulsed voltage which has a width of 1000 ns and shifts from 0 V to 5 V and then to 0 V in order to reset another one byte. By switching the bit line addresses one after another, the same procedure is repeated for one sector. Then, as shown in FIG. 8, the WSM 8 connects the selected word line WLs with 3 V, the selected source line SLs with 0 V, and the selected bit line BLs with a small voltage (e.g., about 0.5 V or lower) enough to give no disturbance to the variable resistance element 1, thus conducting the verify operation for examining whether or not the resistance value of each variable resistance element 1 in the sector is lowered down to a reference level (e.g., 15 kΩ). FIG. 8 illustrates the verify operation with the sector decoder 7, the column decoder 6, the bit line potential selecting circuit 16 and the bit line discharging circuit 17. For the verify operation, the sector decoder 7 connects both the selected and non-selected source lines SLs and SLu with the ground potential GND (0 V). The column decoder 6 is turned at its gate 6a off for the non-selected bit line BLu (0 V at the gate voltage) and on for the selected bit line BLs (3 V at the gate voltage). The bit line potential selecting circuit 16 switches to the sense amplifier circuit 12 which then supplies the variable resistance element 1 with a very small voltage (e.g., 0.5 V or smaller) for examining the resistance value of the variable resistance element 1 in the selected memory cell. More particularly, the voltage generated across both ends of the variable resistance element 1 is measured by the sense amplifier circuit 12 for determining whether the resistance is a desired level or not. The bit line discharging circuit 17 is turned on to discharge the potential from the bit line at the end of the verify operation while remains off during the verify operation. While the non-selected word line WLu is connected with 0 V, the selected word line WLs is supplied with a word line potential (3 V) for the verify operation from the row decoder 5. The sense amplifier circuit 12 shown in FIG. 9 is a comparator circuit for comparing the potential at the variable resistance element 1 with the reference level (15 kΩ, a first reference level at the reset operation) of the reference cell 14. When the sense amplifier circuit 12 determines that the resistance value of the variable resistance element 1 exceeds the first reference level at the reset operation, the WSM 8 repeats the reset operation and the verify operation until the resistance of the variable resistance element 1 becomes not greater than the first reference level (e.g., 15 kΩ).

At the normal read operation, the application of a voltage remains unchanged as shown in FIG. 8. The common operation of reading array data is differentiated from the verify operation in the fact that the sense amplifier circuit 12 shown in FIG. 9 is a comparator circuit for comparing the potential generated at the variable resistance element 1 with the potential at the reference level of the resistance (50 kΩ, the read operation reference level) of the reference cell 14. The sense amplifier circuit 12 will now be described in more detail.

As best shown in FIG. 9, the sense amplifier circuit 12 is connected at one of its two inputs with the selected memory cell 3 to be actuated in the memory array cell selected by the action of the column decoder 6 and the word line WL for either the read operation or the verify operation. The sector decoder 7 determines the potential at the selected source line SLs (at zero or the ground potential GND for the read operation or the verify operation). The other input of the sense amplifier circuit 12 is connected with one of the reference cells 14 selected by the operation of the reference cell selecting circuit 18 and the reference word line WLr. For reading the array data, the gate RD in the reference cell selecting circuit 18 is turned conductive while the other gates remain at the non-selected state. For verifying the write operation, the gate WR is turned conductive while the other gates remain disconnected. For verifying the reset operation, the gate RT1 or RT2 is turned conductive while the other gates remain disconnected. The gates N1 to N3 are auxiliary gates for determining the reference level of the resistance in the reference cell for testing. More particularly, the reference levels of the resistance are set other than the settings determined with the gates RD, WR, RT1 and RT2. As a result, the test will be higher in the quality than the common action thus increasing the number of defectives to be detected. Also, the write/reset circuit (the reference bit line potential switching circuit 19) for the variable resistance element 1 in the reference cell 14 is provided for setting the reference level of each reference cell 14.

When the CSM 9 received a write command from the outside, the WSM 8 starts the write operation. As shown in FIG. 6, the selected word line WLs is connected with 7 V and the non-selected word line WLu and the selected source line SLs are connected with 0 V while the selected bit line BLs is supplied with the pulsed voltage which has a pulse width ranging from 100 ns to 1000 ns and shifts from 0 V to 5V and then to 0 V. As the write operation has been completed, the resistance value of the variable resistance element 1 is turned to a high level (about 140 kΩ representing "1" of the data). Then, as shown in FIG. 8, the WSM 8 connects the selected word line WLs with 3 V, the source line SL with 0 V, and the selected bit line BLs with a very small voltage (about 0.5 V or smaller) to start the verify operation for examining whether or not the resistance value of the variable resistance element 1 in each memory cell 3 in the sector exceeds a reference level (e.g., 90 kΩ) at the write operation. The sense amplifier circuit 12 shown in FIG. 9 compares the potential generated at the variable resistance element 1 with the potential generated at the reference level (90 kΩ, the write operation reference level) of the resistance of the reference cell 14. When the sense amplifier circuit 12 determines that the resistance value of the variable resistance element 1 is lower than the reference level, the WSM 8 repeats the write operation and the verify operation until the resistance value of the variable resistance element 1 exceeds the reference level (90 kΩ, the write operation reference level). It is known that when the pulse width of the pulsed voltage is increased (to longer than about 2000 ns), the resistance value of the variable resistance element 1 fails to increase but may be declined. Therefore, the pulse is controlled not to exceed a rated width (about 2000 ns) by the WSM 8.

A procedure of determining the rated width of the pulse to be applied will now be described in brief. As the write operation on the variable resistance element 1 has been completed after the reset operation, the resistance value of the variable resistance element 1 is increased to 90 kΩ or higher. If the application of the pulsed voltage for the write operation is continued, the resistance of the variable resistance element 1 will be lowered from 90 kΩ. The rated width of the pulse is then determined by a product of the pulse width and the number of applications. As the rated width of the pulse is stored in the nonvolatile memory area 15 (the circuit area in the WSM 8 shown in FIG. 13) in the inventive device, the WSM 8 performs the write operation so that the accumulation of the pulse width stays not exceeding the rated width. The reference level (such as 90 kΩ) of the resistance in the reference cell is arbitrarily determined using the writing circuit in the variable resistance element 1 like that of the memory cell 3 as shown in FIG. 9. Accordingly, the reference level of the resistance can precisely be determined with consideration of variations in the processing operations of each device, thus ensuring optimum characteristics of the device.

SECOND EMBODIMENT

Figure 10:
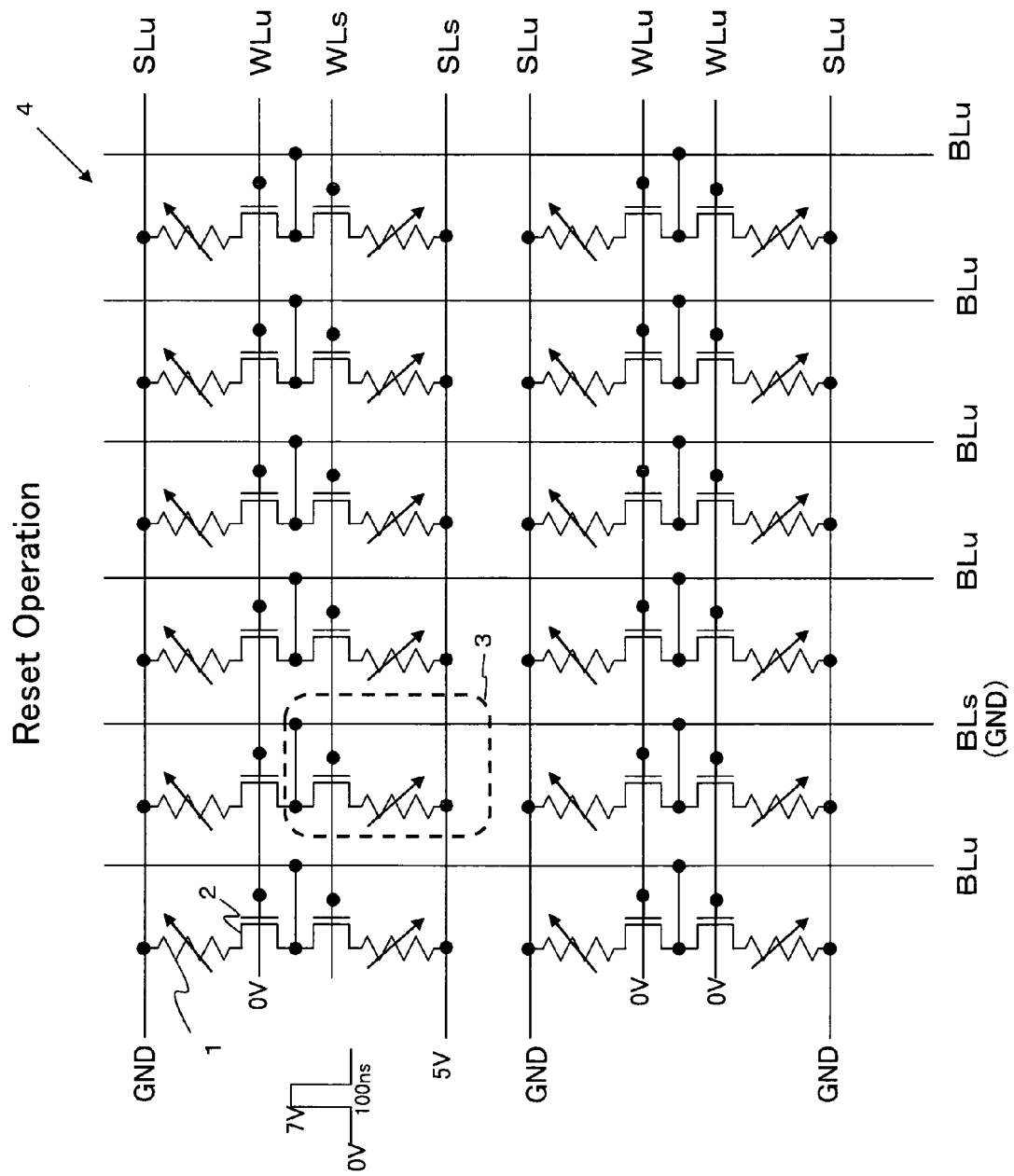
FIG. 10 is a circuit diagram of a memory cell array with voltages applied at the reset operation showing a second embodiment of the nonvolatile semiconductor memory device according to the present invention.

The second embodiment of the inventive device will be described. The primary construction is identical to that of the first embodiment but differentiated by the application of a pulsed voltage at the reset operation. FIG. 10 illustrates an application of voltage at the reset operation of the second embodiment. The second embodiment connects the selected source line SLs constantly with 5 V in place of the resetting pulsed input, the selected bit line BLs in a sub-sector of one byte (8 bits) with the ground potential GND, and the selected word line WLs with a pulsed voltage which has a pulse width of 1000 ns and shifts from 0 V to 7 V and then to 0 V in order to reset the memory cell 3 in the sub-sector of one byte. This is followed by connecting the selected bit line BLs in the succeeding sub-sector of one byte (8 bits) with the ground potential GND and the selected word line WLs with the pulsed voltage which has a pulse width of 1000 ns and shifts from 0 V to 7 V and then to 0 V in order to reset the memory cell 3 in the succeeding sub-sector of one byte. The reset operation for each sub-sector is repeated for one sector. Then, the WSM 8 carries out the verify operation by connecting the selected word line WLs with 3 V, the selected source line SLs with 0 V, and the selected bit line BLs with a very small voltage (about 0.5 V or smaller) so that the sense amplifier circuit 12 examines whether or not the resistance of the variable resistance element 1 in each memory cell 3 in the sector is lower than a reference level (e.g., 15 kΩ, the first reference level at the reset operation). The reset operation and the verify operation are repeated by the WSM 8 until the resistance of the variable resistance element 1 is lower than the reference level (e.g., 15 kΩ). In the second embodiment, the word line WL which is smaller in the loading capacity is supplied with the pulsed input for the reset operation but not the source line SL which is greater in the loading capacity, hence contributing to reduction in the size of the pulse generating circuit.

THIRD EMBODIMENT

Figure 11:
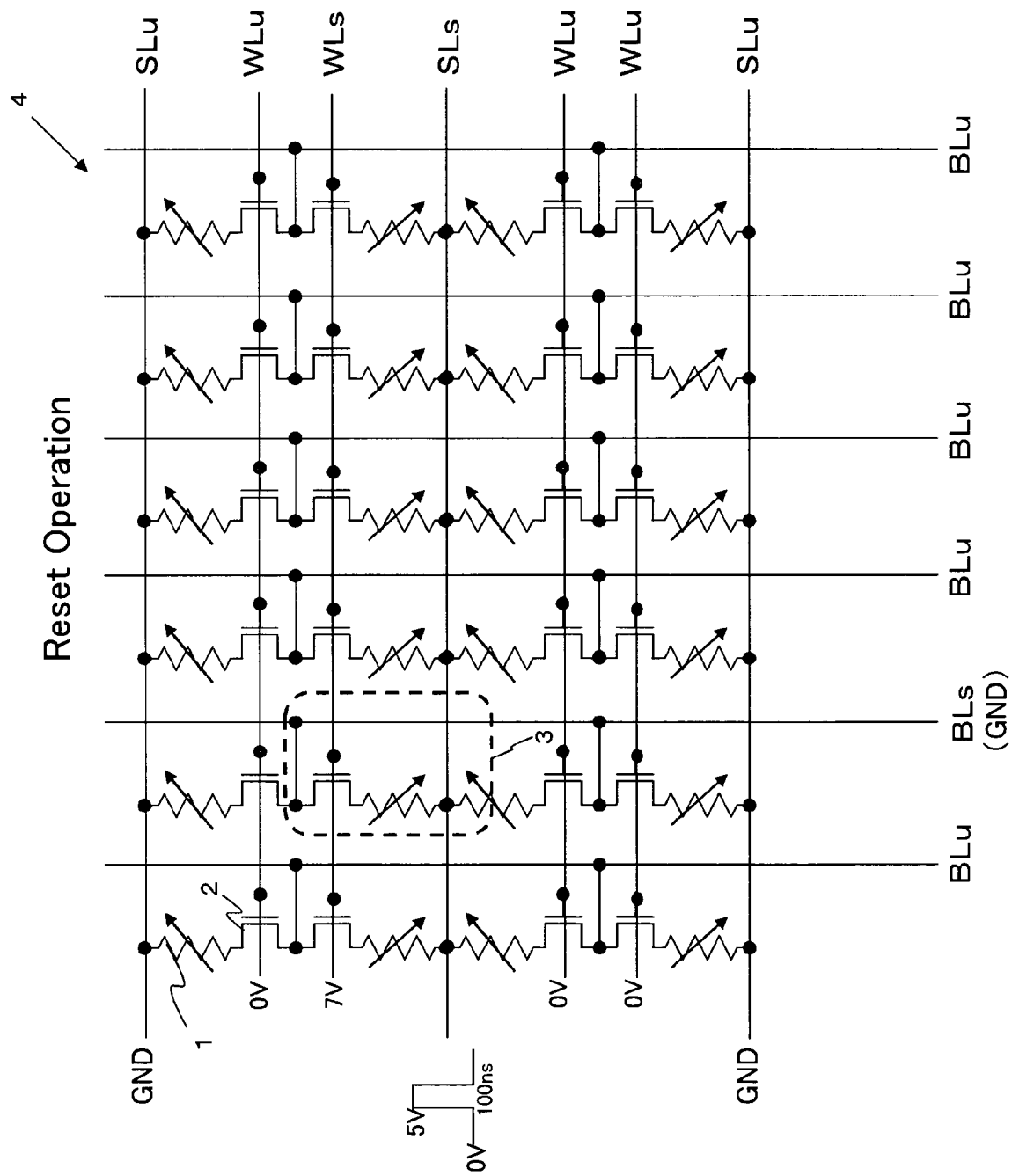
FIG. 11 is a circuit diagram of a memory cell array with voltages applied at the reset operation showing a third embodiment of the nonvolatile semiconductor memory device according to the present invention.
Figure 12:
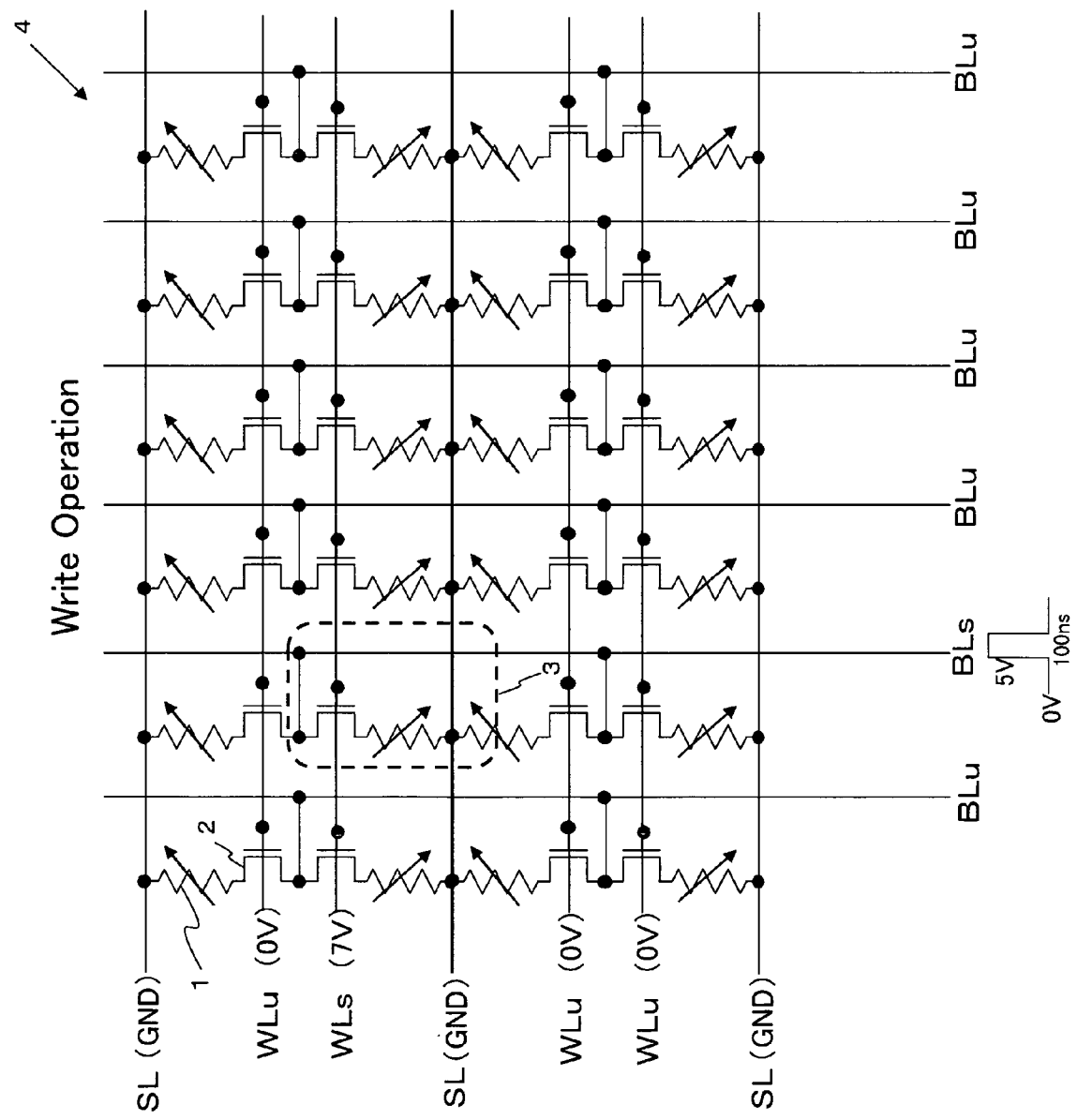
FIG. 12 is a circuit diagram of the memory cell array with voltages applied at the write operation showing the third embodiment of the nonvolatile semiconductor memory device according to the present invention.

The third embodiment of the inventive device will now be described. The primary construction is identical to those of the first and second embodiments but differentiated by the location of the source line SL in the memory cell array 4. The memory cell array 4 in the first or second embodiment has the source line SL like the word line WL provided at each row. The third embodiment allows the source line SL to be shared by two adjacent rows as shown in FIGS. 11 and 12. FIG. 11 illustrates an application of voltage to each signal line at the reset operation of the third embodiment. FIG. 12 illustrates an application of voltage to each signal line at the write operation of the third embodiment. As the source line is shared by two adjacent rows, its cross section can be increased thus minimizing the electric resistance. Also, as the number of the sector decoders 7 is decreased, the circuit construction can be simplified thus minimizing the installation area to be required.

Moreover, since the source line SL is shared by two adjacent memory cells 3 aligned along the column direction, the distance between the two variable resistance elements 1 of their respective memory cells 3 can be shortened thus minimizing the layout extension (size) of the memory cell. With the size of the memory cell remaining unchanged, the cross section of the source line SL can be increased thus minimizing the electric resistance and thus the disturbance due to voltage drop at both the write operation and the reset operation. In other words, when the resistance R at the cross section of the source line SL is too large, the production I×R of the writing current I and the resistance R or the potential may easily vary. As the potential is significantly varied, it will disturb the writing of data into the adjacent memory cell. It is hence desirable to have the resistance R of the source line minimized. Also, the two foregoing advantages (reduction in the size of the memory cell and minimization of the disturbance) may be utilized at the same time but in a compromising manner.

FOURTH EMBODIMENT

When the resistance value of the variable resistance element 1 is declined too low after the reset operation, the memory cell when the pulsed input is supplied for the write operation may receive an excessive amount of current. For compensation, the low level of the resistance value after the reset operation is increased to higher than 4 kΩ, namely, about 8 kΩ. The low level of the resistance can be determined by conducting the following steps after the reset operation in the fourth embodiment. Through conducting the following steps, the requirement for having a large size of the internal pumping circuit thus not to minimize the overall cost and increasing the cross section of each metallic wire line will be eliminated.

(1) Upon the CSM 9 shown in FIG. 3 receiving a sector reset command from the outside, the WSM 8 connects the selected word line WLs in a selected sector with 7 V, the selected bit line BLs of one byte (8 bits) with the ground potential GND, and the selected source line SLs with a pulsed voltage which has a pulse width of 1000 ns and shifts from 0 V to 5 V and thus to 0 V in order to reset the sub-sector of one byte. This is followed by connecting the selected bit line BLs of one byte (8 bits) at the succeeding address with the ground potential GND and the selected source line SLs with the pulsed voltage which has a pulse width of 1000 ns and shifts from 0 V to 5 V and thus to 0 V thus to reset the succeeding sub-sector of one byte. By switching the bit line addresses one after another, the above steps are repeated for one sector. Then, the WSM 8 connects, as shown in FIG. 8, the selected word line WLs with 3 V, the selected source line SLs with 0 V, and the selected bit line BLs with a very small voltage (e.g., about 0.5 V or smaller) enough to give no disturbance to the variable resistance element 1, thus conducting the verify operation for examining whether or not the resistance value of each variable resistance element 1 in the sector is lowered down to a reference level (e.g., 15 kΩ). The sense amplifier circuit 12 shown in FIG. 9 is a comparator circuit for comparing the potential generated at the variable resistance element 1 with the potential generated at the reference level of the resistance (15 kΩ, the first reference level at the reset operation) of the reference cell 14. The gate RT1 shown in FIG. 9 is turned conductive. When the sense amplifier circuit 12 determines that the potential generated at the variable resistance element 1 exceeds the first reference level of the resistance, the WSM 8 repeats the reset operation and the verify operation until the resistance value of the variable resistance element 1 is lower than the first reference level (e.g., 15 kΩ) at the reset operation.

(2) Thereafter, the gate RT2 shown in FIG. 9 is turned conductive to switch the reference cell 14 of the reference level of 8 kΩ (the second reference level at the reset operation). As shown in FIG. 8, the verify operation is repeated at each variable resistance element 1 for examining whether or not the resistance of the variable resistance element 1 in each memory cell 3 in the sector exceeds the second reference level of 8 kΩ. When the sense amplifier circuit 12 determines that the resistance value of the variable resistance element 1 does not exceed the second reference level at the reset operation, the WSM 8 repeats the write operation and the verify operation with the use of a small pulsed voltage, 3 V and 100 ns in the pulse width, until the resistance value of the variable resistance element 1 exceeds the second reference level (8 kΩ).

FIFTH EMBODIMENT

While the WSM 8 starts the reset operation upon the sector reset command received at the CSM 9 from the outside throughout the first to fourth embodiments, the fifth embodiment triggers the following steps before starting the reset operation.

Upon receiving the sector reset command at the CSM 9 from the outside, the WSM 8 initiates the verify operation. The WSM 8 connects, as shown in FIG. 8, the selected word line WLs with 3 V, the selected source line SLs with 0 V, and the selected bit line BLs with a very small voltage (e.g., about 0.5 V or smaller) enough to give no disturbance to the variable resistance element 1, thus conducting the verify operation on each variable resistance element 1 for examining whether or not the resistance value of the variable resistance element 1 in the sector is lowered down to a reference level (e.g., 15 kΩ). The sense amplifier circuit 12 shown in FIG. 9 is a comparator circuit for comparing the potential generated at the variable resistance element 1 with the potential generated at the reference level of the resistance (15 kΩ, the first reference level at the reset operation) of the reference cell 14. The gate RT1 shown in FIG. 9 is turned conductive. When the sense amplifier circuit 12 determines that the resistance value of the variable resistance element 1 is lower than the first reference level of the resistance (15 kΩ) at the reset operation, the reset operation is finished with applying no more pulsed input.

SIXTH EMBODIMENT

The fifth embodiment may be modified as follows.

Upon receiving the sector reset command at the CSM 9 from the outside, the WSM 8 initiates the verify operation. More specifically, the WSM 8 connects, as shown in FIG. 8, the selected word line WLs with 3 V, the selected source line SLs with 0 V, and the selected bit line BLs with a very small voltage (e.g., about 0.5 V or smaller) enough to give no disturbance to the variable resistance element 1, thus conducting a first step of the verify operation on each variable resistance element 1 for examining whether or not the resistance value of the variable resistance element 1 in the sector is lowered down to a reference level (e.g., 15 kΩ). The sense amplifier circuit 12 shown in FIG. 9 is a comparator circuit for comparing the potential generated at the variable resistance element 1 with the potential generated at the reference level of the resistance (15 kΩ, the first reference level at the reset operation) of the reference cell 14. The gate RT1 shown in FIG. 9 is turned conductive. When the sense amplifier circuit 12 determines that the resistance value of the variable resistance element 1 is lower than the first reference level of the resistance (15 kΩ) at the reset operation, a second step of the verify operation is triggered for each of the variable resistance elements 1.

The second step of the verify operation turns the gate RT2 shown in FIG. 9 conductive and switches to the reference cell 14 of the reference resistance level of 8 kΩ (the second reference level of the resistance), and examines whether or not the resistance value of the variable resistance element 1 in each memory cell 3 in the sector exceeds the second reference level of 8 kΩ at the reset operation. When the sense amplifier circuit 12 determines that the resistance value of all the variable resistance elements 1 exceeds the second reference level at the reset operation, the reset operation is finished with applying no more pulsed input.

Preferably, when the sense amplifier circuit 12 judges that the resistance value of the variable resistance element 1 in at least one of the memory cells 3 does not exceed the second reference level at the reset operation, the WSM 8 repeats the write operation and the verify operation with the use of a small pulsed voltage, 3 V and 100 ns in the pulse width, until the resistance value of the variable resistance element 1 in the memory cell 3 exceeds the second reference level (8 kΩ).

SEVENTH EMBODIMENT

While the WSM 8 starts the reset operation upon the sector reset command received at the CSM 9 from the outside throughout the first to fourth embodiments, the seventh embodiment triggers the following steps.

(1) Upon receiving the sector reset command at the CSM 9 from the outside, the WSM 8 initiates the write operation. As shown in FIG. 6, with connecting the selected word line WLs with 7 V, the non-selected word line WLu with 0 V, and the selected source line SLs with 0 V, the selected bit line BLs is supplied with a pulsed voltage which has a pulse width ranging from 100 ns to 1000 ns and is shifted from 0 V to 5 V and then to 0 V. When the write operation has been completed, the resistance value of the variable resistance element 1 is turned to a high level. Then, as shown in FIG. 8, the WSM 8 connects the selected word line WLs with 3 V, the source line SL with 0 V, and the selected bit line BLs with a very small voltage (about 0.5 V or smaller) to conduct the verify operation for examining whether or not the resistance value of the variable resistance element 1 in each memory cell 3 in the sector exceeds a reference level (e.g., 90 kΩ) at the write operation. The sense amplifier circuit 12 shown in FIG. 9 is a comparator circuit for comparing the potential generated at the variable resistance element 1 with the potential generated at the reference level of the resistance (90 kΩ, the reference resistance level at the write operation) of the reference cell 14. The gate WR shown in FIG. 9 is turned conductive. When the sense amplifier circuit 12 determines that the resistance value of the variable resistance element 1 is lower than the reference level, the WSM 8 repeats the write operation and the verify operation until the resistance value of all the variable resistance elements 1 exceeds the reference level (90 kΩ, the reference resistance level at the write operation).

(2) When the resistance value of all the variable resistance elements 1 exceeds the reference level (90 kΩ, the reference resistance level at the write operation), the WSM 8 connects the selected word line WLs in the selected sector with 7 V, the selected bit line BLs in the selected sub-sector of one byte (8 bits) with the ground potential GND, and the selected source line SLs with a pulsed voltage which has a width of 1000 ns and shifts from 0 V to 5 V and then to 0 V (or with a 100 ns width pulsed voltage applied ten times) in order to reset one byte of the memory cells 3. This is followed by connecting the selected bit line BLs in the sub-sector of one byte (8 bits) at the next address with the ground potential GND and the selected source line SLs with the pulsed voltage which has a width of 1000 ns and shifts from 0 V to 5 V and then to 0 V in order to reset another one byte. By switching the bit line addresses one after another, the same procedure is repeated for one sector. Then, as shown in FIG. 8, the WSM 8 connects the selected word line WLs with 3 V, the selected source line SLs with 0 V, and the selected bit line BLs with a very small voltage (e.g., about 0.5 V or lower) enough to give no disturbance to the variable resistance element 1, thus conducting the verify operation for examining whether or not the resistance value of each variable resistance element 1 in the sector is lowered down to a reference level (e.g., 15 kΩ). The sense amplifier circuit 12 shown in FIG. 9 is a comparator circuit for comparing the potential generated at the variable resistance element 1 with the potential generated at the reference level (15 kΩ, the first reference level at the reset operation) of the reference cell 14. When the sense amplifier circuit 12 determines that the resistance value of the variable resistance element 1 exceeds the first reference level at the reset operation, the WSM 8 repeats the reset operation and the verify operation until the resistance value of the variable resistance element 1 becomes not greater than the first reference level (15 kΩ).

EIGHTH EMBODIMENT

In the first embodiment, in response to the write command received from the outside at the CSM 9, the WSM 8 permits the selected bit lines BLs connected to the selected memory cells to be simultaneously supplied with the pulsed voltage which has a pulse width ranging from 100 ns to 1000 ns and shifts from 0 V to 5 V and then to 0 V for the write operation when two or more of the memory cells are selected to be written with the data of "0". The eighth embodiment however supplies the pulsed voltage not simultaneously or parallelly when two or more of the selected bit lines BLs are connected. In particular, the selected bit lines BLs are grouped by one to four. One to four of the selected bit lines BLs are then supplied in a time-division based sequence with the pulsed voltage. The verify operation after the application of the pulsed voltage is identical to that of the first embodiment and will be described in no more detail.

It is also preferable that the number of the selected bit lines BLs to be simultaneously supplied with the pulsed voltage is minimized at the first application and then a more number of the selected bit lines BLs are supplied with the pulsed voltage from the second application. For example, the pulsed voltage is fed to one of the selected bit lines BLs at the first application and then two of the selected bit lines BLs simultaneously at the second application. After the third application, the remaining of the selected bit lines BLs are supplied at once with the pulsed voltage. This sequential action can successfully limit the instantaneous current received by the memory cells at the write operation or particularly just after the start of the write operation.

Some modifications of the embodiments will now be described.

Figure 13:
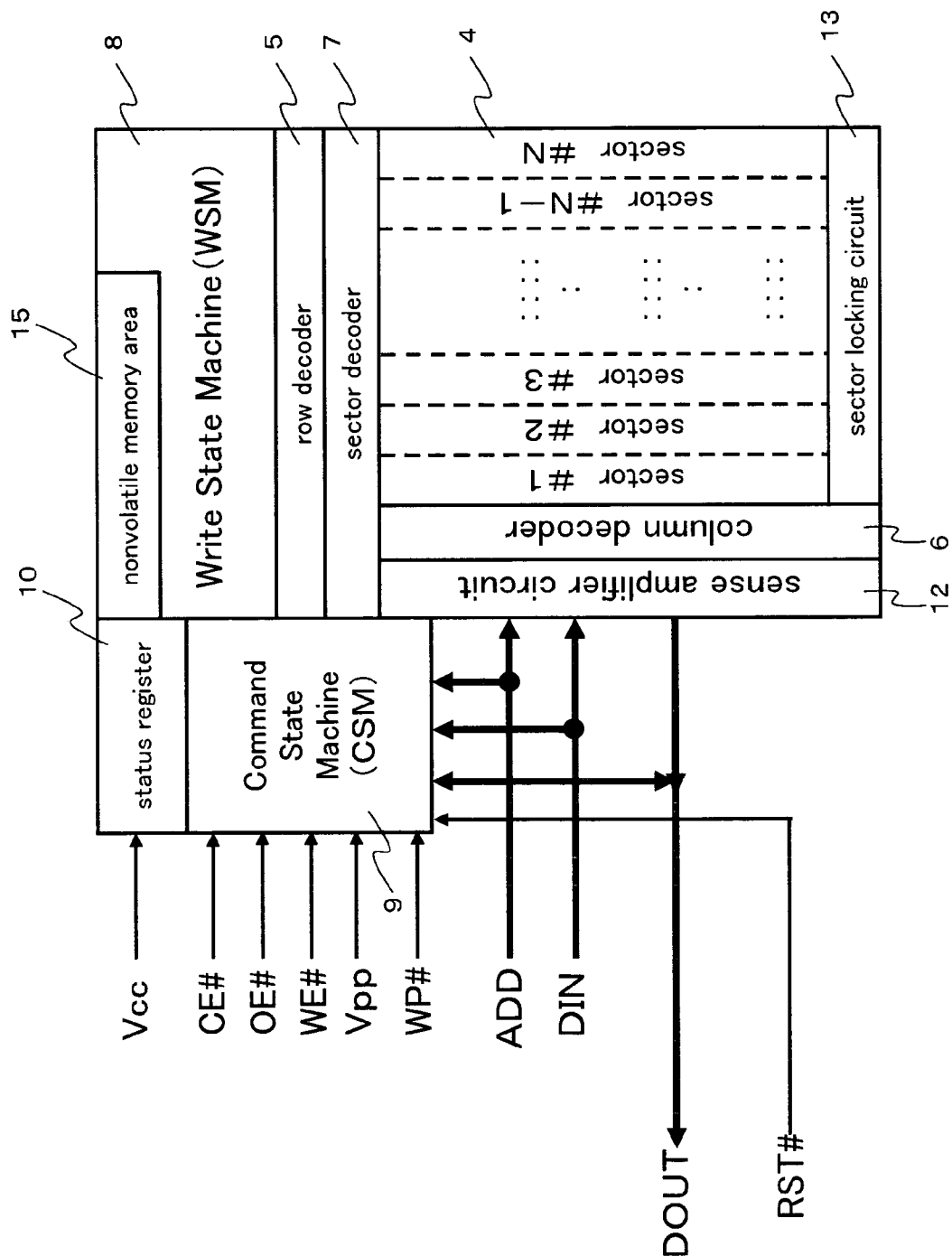
FIG. 13 is a block diagram schematically showing one modification of the nonvolatile semiconductor memory device according to the present invention.
Figure 14:
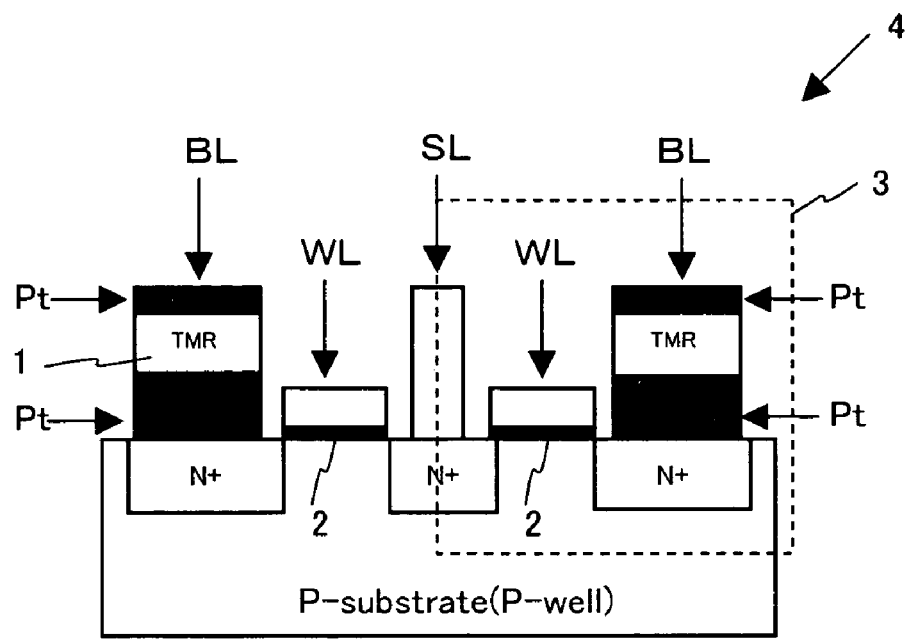
FIG. 14 is a circuit diagram showing a conventional memory cell construction of an MRAM format with a spin injection method.
Figure 14:
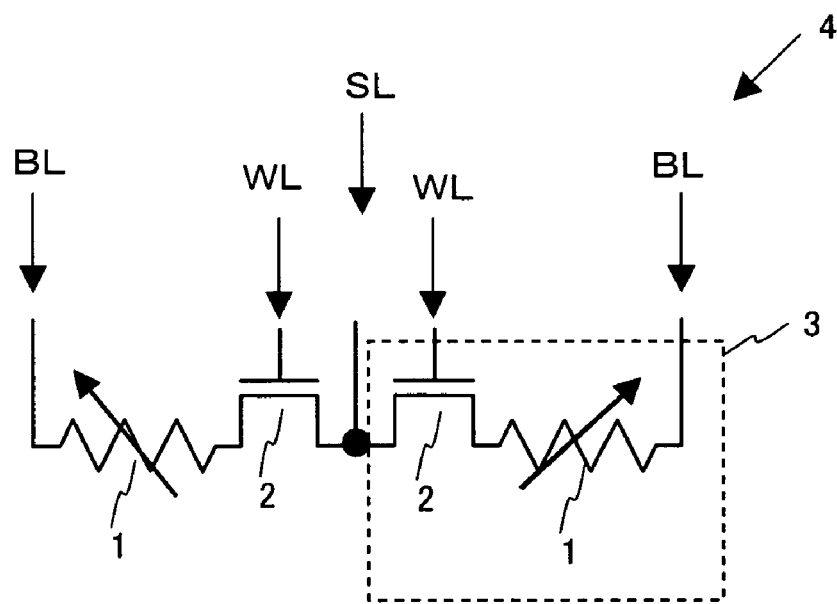
Figure 15:
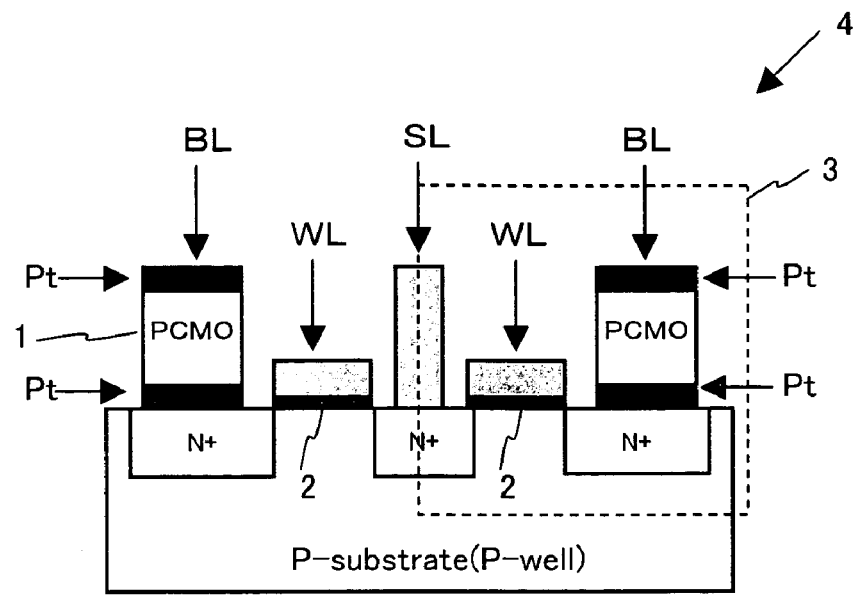
FIG. 15 is a circuit diagram showing a conventional memory cell construction of an RRAM format.
Figure 15:
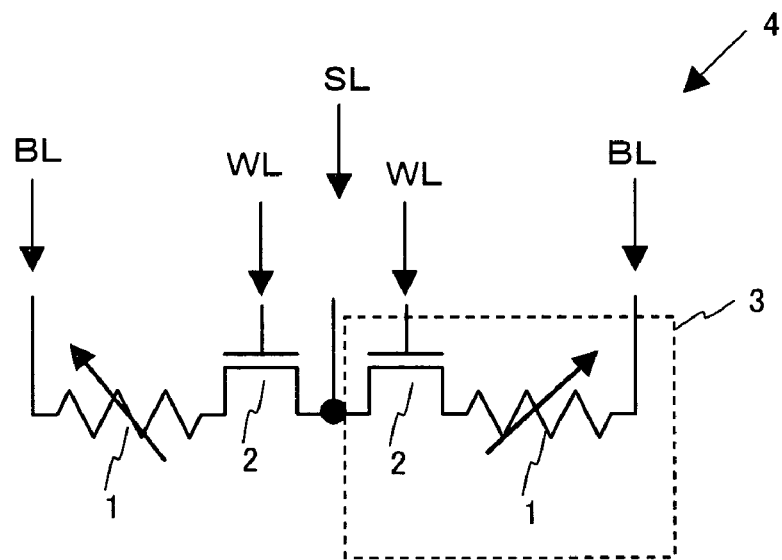
Figure 16:
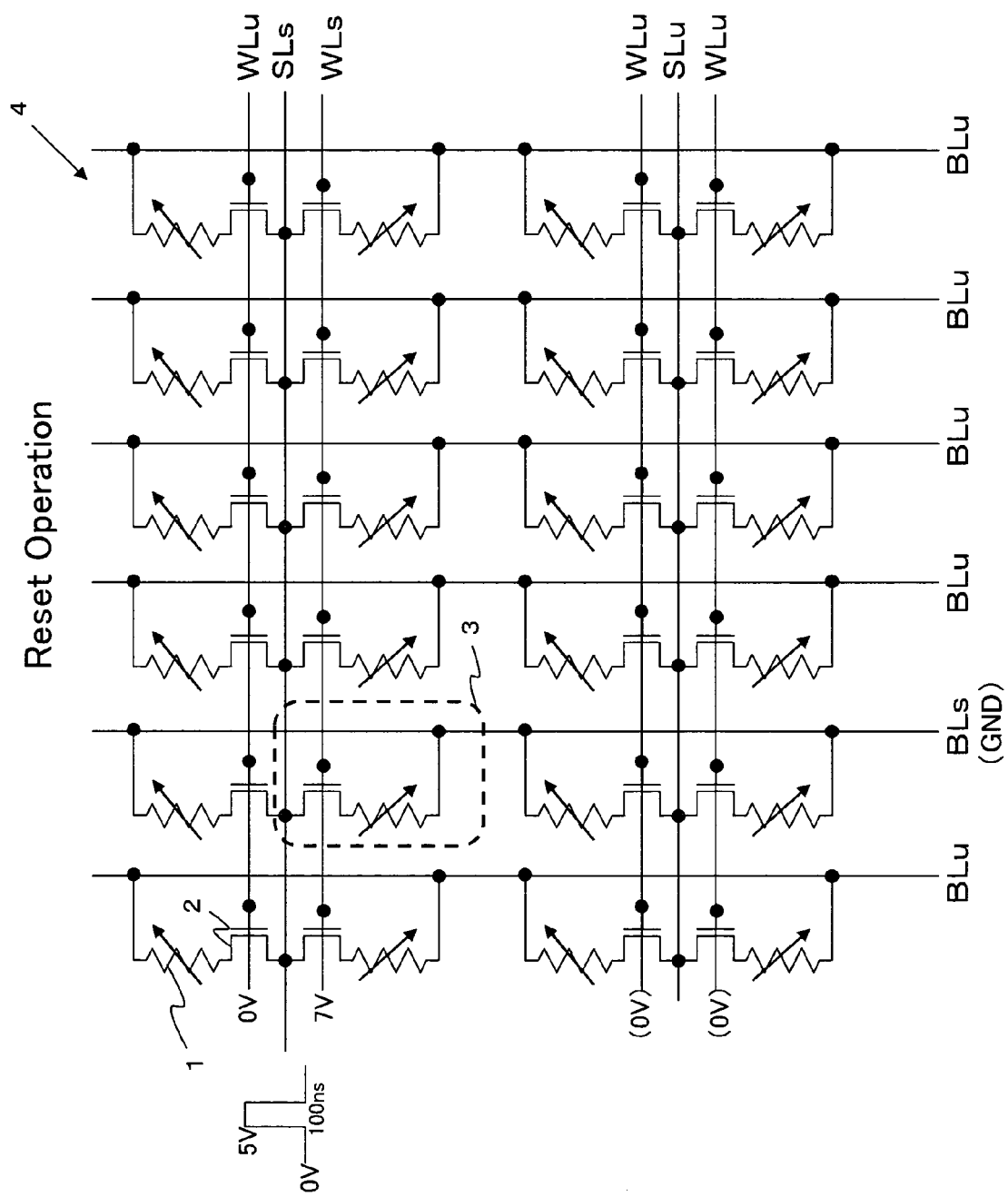
FIG. 16 is a circuit diagram showing a conventional memory cell array of an RRAM format with voltages applied at the reset operation.
Figure 17:
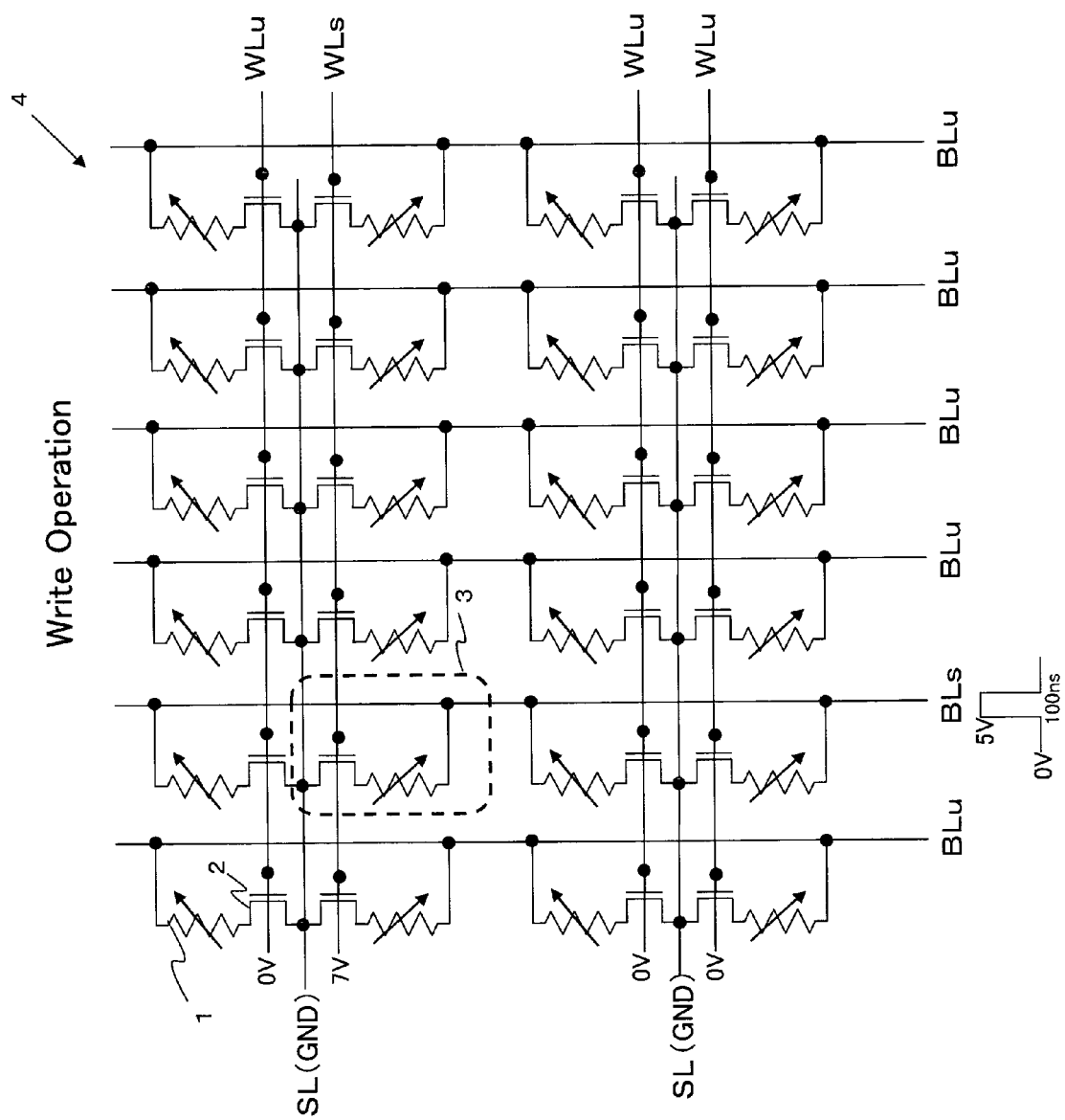
FIG. 17 is a circuit diagram showing the conventional memory cell array of an RRAM format with voltages applied at the write operation.
Figure 18:
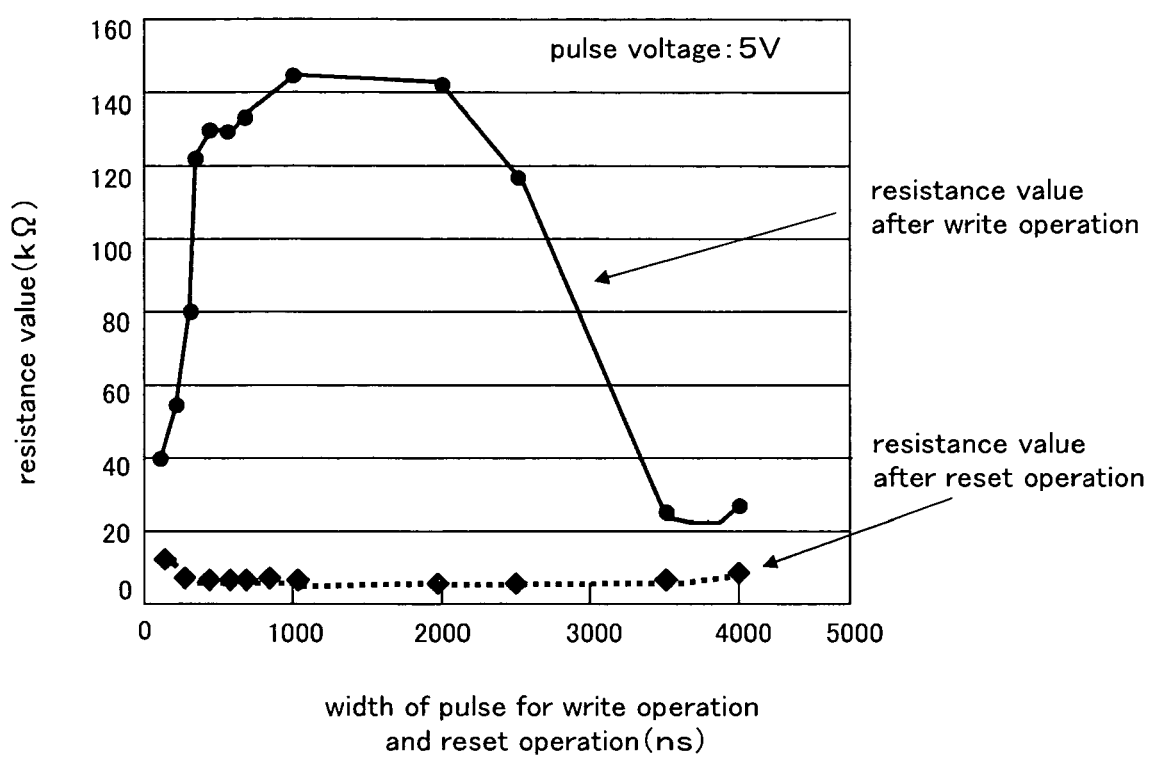
FIG. 18 is a graph showing the relationship between the width of pulse for the write operation and the reset operation and the resistance of an RRAM memory element.

(1) In each of the foregoing embodiments, the write/reset voltage generation circuit 11 is provided for supplying a voltage for the reset/write operation as shown in FIG. 3. The circuit 11 may be replaced by a (dedicated) source terminal for the reset/write operation through which voltage inputs for the reset/write operation are supplied from an outside source. In the latter case, the write/reset voltage generation circuit 11 or a bulky, large capacity source circuit needs not to be provided in the inventive device because 5 V of pulsed voltage for the reset/write operation is received from the outside source, as shown in FIG. 13. Also, the reset operation can be conducted at once with a more number of the memory cells.

(2) In each of the foregoing embodiments, the resistance value of the variable resistance element 1 is turned to a lower level after the reset operation and a higher level after the write operation. Alternatively, the variable resistance element 1 can be turned upside down in the structure so that its resistance is turned to a higher level after the reset operation and a lower level after the write operation. In other words, the write operation and the reset operation can be inverted each other in control. Also, as the pulsed voltage (current) is 5 V in the embodiments, it may be increased for changing the resistance at a higher speed or decreased for retarding the change of the resistance.

Moreover, the values of the voltage and the pulse width (including a product of short pulse width and number of applications) denoted in the foregoing embodiments are simply illustrative but not of limitations and may appropriately be determined depending on the manufacturing conditions of the memory cells.

(3) In the foregoing embodiments, the memory cell is designed to save one bit (two different values). The resistance of the variable resistance element 1 may be leveled between the maximum and the minimum so that multi-value data of three or more values in two or more bits are stored in the variable resistance element 1. Accordingly, the present invention is applicable to a multi-value nonvolatile storage apparatus or a system LSI including multi-value nonvolatile memories with equal success.

(4) The memory cell array is not limited to the constructions of the foregoing embodiments. While the source lines SL extend in parallel to the word lines WL in the embodiments, they may be arranged in parallel with the bit lines BL. For instance, the source lines SL may be imaginary lines or switched with the bit lines BL for providing a desired function(s) in relation to the selected memory cell.

The construction of the sector like the memory cell array is not limited to that of the foregoing embodiments. The number of memory cells as well as the number of row and columns in the sector can arbitrarily be determined depending on the application.

Although the present invention has been described in terms of preferred embodiments, it will be appreciated that various modifications and alterations might be made by those skilled in the art without departing from the spirit and scope of the invention. The invention should therefore be measured in terms of the claims which follow.

What is claimed is:

1. A nonvolatile semiconductor memory device comprising:
   an array of nonvolatile memory cells arranged in both rows and columns; and a combination of word lines and bit lines arranged to extend in the row and column directions respectively so that they can select one of or a group of the memory cells for operation, wherein
   the memory cell has a variable resistance element, in which data is stored through a change in electric resistance, connected at one end to a source of a selection transistor,
   the selection transistor is connected at a drain to the bit line extending commonly along the column direction and at a gate to the word line extending commonly along the row direction while the variable resistance element is connected at the other end to a source line in the memory cell array,
   a write operation on the memory cell can be electrically executed by a predetermined voltage applied to the selected word line to turn the selection transistor conductive and a predetermined writing voltage or current applied between the selected bit line and the selected source line, and
   the reset operation on the memory cell can be electrically executed on the sector-by-sector basis, each sector including the plurality of memory cells connected to the common source line, by a predetermined voltage applied to the selected word line to turn the selection transistor conductive and a predetermined resetting voltage or current applied between the selected bit line and the selected source line.

2. The nonvolatile semiconductor memory device according to claim 1, wherein
   the reset operation is executed by a pulsed form of a predetermined resetting voltage or current applied to the selected source line while the selected bit line is fixed at a resetting potential.

3. The nonvolatile semiconductor memory device according to claim 1, wherein
   the reset operation is executed by a pulsed form of the predetermined voltage applied to the selected word line while the selected bit line and the selected source line are fixed at their respective resetting potentials.

4. The nonvolatile semiconductor memory device according to claim 1, wherein
   the sector is divided into sub-sectors, and
   the reset operation is executed in a time-division manner for each sub-sector.

5. The nonvolatile semiconductor memory device according to claim 4, wherein
   the sub-sector to be subjected to the reset operation is determined by selecting the bit line connected to the memory cell in the sub-sector.

6. The nonvolatile semiconductor memory device according to claim 5, wherein
   the sub-sector to be subjected to the reset operation is determined by holding at the resetting potential the bit line connected to the memory cell in the sub-sector, whereby the bit line connected to the memory cell in the sub-sector will be at the floating state thus to allow no selection of the other sub-sectors.

7. The nonvolatile semiconductor memory device according to claim 4, wherein
   the reset operation is intended to lower the electric resistance of the memory cell, and
   the resistance value of the memory cell in the sub-sector to be subjected to a time-division manner of the reset operation is controlled to stay not lower than a lower limit level.

8. The nonvolatile semiconductor memory device according to claim 1, wherein
   the operation of lowering the electric resistance of the memory cell in the write operation or the reset operation is canceled when the resistance value of the memory cell is found lower than a reference level through comparison between the resistance value of the memory cell and the reference level during the action.

9. The nonvolatile semiconductor memory device according to claim 1, wherein
   the reset operation is intended to lower the electric resistance of the memory cell, and
   the reset operation is preceded by a verify operation for examining whether or not the resistance value of each memory cell to be subjected to the reset operation is lower than the predetermined reference level and when the every resistance value is lower than the reference level, the reset operation is not started.

10. The nonvolatile semiconductor memory device according to claim 1, wherein
    the reset operation is intended to lower the electric resistance of the memory cell,
    the reset operation is preceded by a first verify operation for examining whether or not the resistance value of each memory cell to be subjected to the reset operation is lower than a first reference level, and when the every resistance value is lower than the first reference level, a second verify operation is conducted for examining whether or not the resistance value of the memory cell is higher than a second reference level and, when the every resistance value is higher than the second reference level, the reset operation is not started.

11. The nonvolatile semiconductor memory device according to claim 10, wherein in the second verify operation, when at least one of the resistance values is not higher than the second reference level, the write operation is conducted on the memory cell of which the resistance value is not higher than the second reference level under a writing condition that the resistance value stays higher than the second reference level and lower than the first reference level.

12. The nonvolatile semiconductor memory device according to claim 1, wherein the reset operation is intended to lower the electric resistance of the memory cell, and the reset operation is preceded by the write operation for raising the resistance value of the memory cell to be subjected to the reset operation.

13. The nonvolatile semiconductor memory device according to claim 1, wherein the write operation is intended to raise the electric resistance of the memory cell, and the write operation is controlled so that it stops before the resistance value of the memory cell reaches a maximum during the write operation.

14. The nonvolatile semiconductor memory device according to claim 13, wherein the resistance value of the memory cell during the write operation is compared with a write operation reference level predetermined to not higher than the maximum and the write operation is controlled to stop before the resistance value of the memory cell during the write operation reaches the maximum.

15. The nonvolatile semiconductor memory device according to claim 13, wherein the resistance value of the memory cell during the write operation is compared with a write operation reference level predetermined to not higher than the maximum and the duration of time where the writing voltage is being applied or the number of applications of the writing voltage for allowing the resistance value of the memory cell during the write operation to reach the maximum is stored in an embedded nonvolatile memory area.

16. The nonvolatile semiconductor memory device according to claim 1, wherein the write operation is intended to raise the electric resistance of the memory cell, and the memory cells to be subjected to the write operation is divided into groups and the write operation is executed in a time-division manner for each group at least at the first application of the writing voltage.

17. The nonvolatile semiconductor memory device according to claim 16, wherein as the write operation proceeds, the group is modified to increase the number of the memory cells in the group.

18. The nonvolatile semiconductor memory device according to claim 1, wherein the write operation and the reset operation are executed in response to command data received at a predetermined input terminal or input/output terminal.

19. The nonvolatile semiconductor memory device according to claim 1, wherein the write operation and the reset operation employ reference levels which are determined by the same variable resistance element as in the memory cell for verifying or comparing the resistance value of the memory cell.

20. The nonvolatile semiconductor memory device according to claim 1, further comprising:

a plurality of source terminals including dedicated source terminals for use with the write operation and the reset operation, wherein the operating current received by the memory cell in the write operation or the reset operation is supplied from a source current through the dedicated terminal.

21. The nonvolatile semiconductor memory device according to claim 1, further comprising:

a bit line discharging circuit for connecting the bit line with a ground potential at the standby state where none of the read operation, the write operation, and the reset operation on the memory cell is conducted.

22. The nonvolatile semiconductor memory device according to claim 1, further comprising:

a comparator for comparing the resistance value of the memory cell with its reference level, the comparator connected at one of two inputs to a plurality of reference resistors via a reference resistance selecting circuit, the reference resistors providing reference levels for use with the read operation, the write operation, the reset operation, and a test on the memory cell; and a reference resistance writing circuit for setting the reference resistors to predetermined resistance levels.

23. The nonvolatile semiconductor memory device according to claim 1, wherein the memory cell is arranged to be at a data protection state where the write operation and the reset operation are inhibited at least for each sector.

24. The nonvolatile semiconductor memory device according to claim 1, wherein the variable resistance element is fabricated using a CMR (Colossal Magneto-Resistive) layer or a TMR (Tunneling Magneto-Resistive) layer.

25. The nonvolatile semiconductor memory device according to claim 1, wherein the variable resistance element is made of an oxide having a perovskite structure containing manganese.

* * * * *